(12) United States Patent
Nagashima

(10) Patent No.: US 12,116,697 B2
(45) Date of Patent: Oct. 15, 2024

(54) GROUP III NITRIDE SINGLE CRYSTAL SUBSTRATE AND METHOD FOR PRODUCTION THEREOF

(71) Applicant: TOKUYAMA CORPORATION, Shunan (JP)

(72) Inventor: Toru Nagashima, Shunan (JP)

(73) Assignee: TOKUYAMA CORPORATION, Shunan (JP)

( * ) Notice: Subject to any disclaimer, the term of this patent is extended or adjusted under 35 U.S.C. 154(b) by 405 days.

(21) Appl. No.: 17/773,475

(22) PCT Filed: Dec. 24, 2020

(86) PCT No.: PCT/JP2020/048513
§ 371 (c)(1),
(2) Date: Apr. 29, 2022

(87) PCT Pub. No.: WO2021/132491
PCT Pub. Date: Jul. 1, 2021

(65) Prior Publication Data
US 2022/0364267 A1 Nov. 17, 2022

(30) Foreign Application Priority Data
Dec. 24, 2019 (JP) .................................. 2019-233420

(51) Int. Cl.
*C30B 29/40* (2006.01)
*C30B 25/20* (2006.01)
(Continued)

(52) U.S. Cl.
CPC ............ *C30B 29/403* (2013.01); *C30B 25/20* (2013.01); *C30B 33/00* (2013.01);
(Continued)

(58) Field of Classification Search
CPC ....... C30B 29/403; C30B 25/20; C30B 33/00; H01L 21/02024; H01L 21/02389; H01L 21/0254
See application file for complete search history.

(56) References Cited

U.S. PATENT DOCUMENTS

2004/0221799 A1  11/2004  Nakayama et al.
2011/0156213 A1   6/2011  Arakawa et al.
(Continued)

FOREIGN PATENT DOCUMENTS

JP  3581145 B1  10/2004
JP  5093127 B2  12/2012
(Continued)

OTHER PUBLICATIONS

International Search Report for PCT/JP2020/048513 mailed on Mar. 16, 2021.

*Primary Examiner* — David Sample
*Assistant Examiner* — Donald M Flores, Jr.
(74) *Attorney, Agent, or Firm* — Birch, Stewart, Kolasch & Birch, LLP

(57) ABSTRACT

A group III nitride single crystal substrate comprises: a first main face; and a first back face opposite to the first main face, wherein an absolute value of a radius of curvature of the first main face of the substrate is 10 m or more; an absolute value of a radius of curvature of a crystal lattice plane at a center of the first main face of the substrate is 10 m or more; and a 1/1000 intensity width of an X-ray rocking curve of a low-incidence-angle face at the center of the first main face of the substrate is 1200 arcsec or less.

11 Claims, 11 Drawing Sheets

(51) Int. Cl.
  *C30B 33/00*   (2006.01)
  *H01L 21/02*   (2006.01)
(52) U.S. Cl.
  CPC .. *H01L 21/02024* (2013.01); *H01L 21/02389* (2013.01); *H01L 21/0254* (2013.01)

(56) References Cited

U.S. PATENT DOCUMENTS

| | | | |
|---|---|---|---|
| 2015/0093318 A1* | 4/2015 | Enatsu | H01L 21/02433 423/409 |
| 2017/0330745 A1 | 11/2017 | Nagashima et al. | |
| 2019/0093255 A1 | 3/2019 | Nagashima et al. | |
| 2019/0198312 A1 | 6/2019 | Yoshida et al. | |

FOREIGN PATENT DOCUMENTS

| | | |
|---|---|---|
| JP | 2013-209260 A | 10/2013 |
| JP | 2014-141413 A | 8/2014 |
| JP | 2016-94337 A | 5/2016 |
| JP | 2018-78260 A | 5/2018 |
| JP | 2019-112266 A | 7/2019 |
| WO | WO 2017/164233 A1 | 9/2017 |

\* cited by examiner

GROUP III NITRIDE SINGLE CRYSTAL SUBSTRATE AND METHOD FOR PRODUCTION THEREOF

TECHNICAL FIELD

The present invention relates to a high-quality group III nitride single crystal which are optimal for growing a device layer such as a light emitting device or an electronic device, and a method for production of the group III nitride single crystal substrate.

BACKGROUND

Group III nitride semiconductors such as aluminum nitride, gallium nitride, and indium nitride, can form mixed crystal semiconductors of freely-selected compositions, and can have various bandgap values depending on mixed crystal compositions thereof. Use of group III nitride single crystals thus allows production of light emitting devices of a wide range of emission wavelength ranging from infrared to ultraviolet wavelengths. Intensive efforts have been recently made to develop light emitting devices employing aluminum-based group III nitride semiconductors (mainly aluminum gallium nitride mixed crystal).

At present, sapphire substrates are commonly employed for production of group III nitride light emitting devices, in view of crystal quality, ultraviolet transparency, mass productivity, and cost. When a group III nitride is grown over a sapphire substrate, though, differences of e.g., lattice constants and thermal expansion coefficients between the sapphire substrate and the group III nitride (such as aluminum gallium nitride) which forms an epitaxial semiconductor layer make the epitaxial layer suffer e.g., crystal defects (misfit dislocation) and cracks, which may result in lower emission performance of the device. In view of improving device performance, it is desirable to employ a substrate which has lattice constants and thermal expansion coefficients close to those of the epitaxial semiconductor layer. Thus, as a substrate for production of the aluminum-based group III nitride semiconductor light emitting devices, it is preferable to employ a group III nitride single crystal substrate such as aluminum nitride and aluminum gallium nitride.

Vapor phase growth methods, such as sublimation (PVT: Physical Vapor Transport), metalorganic vapor phase epitaxy (MOCVD: Metalorganic Chemical Vapor Deposition), and hydride vapor phase epitaxy (HVPE: Hydride Vapor Phase Epitaxy), are known as production methods of such group III nitride single crystal substrates. PVT is a method which sublimes a solid group III nitride at a high temperature and makes it deposit over a base substrate at a lower temperature. The PVT method is advantageous in that it can grow a thick layer at a high growth rate. MOCVD and HVPE are methods which produce single crystals by reacting a group III source gas and a nitrogen source gas (such as ammonia gas) over a base substrate. and are advantageous in that a high-purity group III nitride single crystal can be obtained. Also known are producing a group III nitride single crystal substrate by a liquid phase method such as a sodium flux method or an ammonothermal method.

Issues of the group III nitride single crystal substrate obtained by the above production method include variance of the radius of curvature of the single crystal substrate itself and variance of the radius of curvature in the substrate. The radius of curvature referred to here encompasses both the radius of curvature of the crystal lattice plane of the group III nitride single crystal, and the radius of curvature of the device growth surface of the group III nitride single crystal substrate (hereinafter may be referred to as a "main face" of the group III nitride single crystal). Radius of curvature of the crystal lattice plane of the group III nitride single crystal becomes small derived from warpage of the crystal lattice plane, indicating the magnitude of the curvature of the crystal lattice plane. The radius of curvature of the main face of the group III nitride single crystal becomes small derived from warpage of the surface of the main face, indicating the magnitude of the curvature of the surface. The small radius of curvature of the crystal lattice plane of the group III nitride single crystal and the small radius of curvature of the main face of the group III nitride single crystal mean that the crystal lattice plane of the group III nitride single crystal is considerably curved and that the surface of the main face is considerably curved respectively, and thus affecting variance of the off-angle of the group III nitride single crystal substrate surface, and affecting variance of the quality of the device layer formed on the group III nitride single crystal substrate. For example, variations in the composition of the aluminum gallium nitride used in the light emitting device layer, and variations in surface roughness occur, leading to variations in emission wavelength of the light emitting device, degraded output performances, and/or a reduced yield.

For this reason, a group III nitride single crystal with improved radius of curvature and a crystal growth method thereof have been proposed. For example, Patent Literature 2 proposes to improve the radius of curvature of the surface shape of the group III nitride single crystal substrate by an improved polishing method. Patent Literature 3 proposes a group III nitride single crystal substrate having a constant radius of curvature produced using a GaAs single crystal substrate as a seed substrate. Patent Literature 4 proposes a group III nitride single crystal substrate having an improved radius of curvature in a direction parallel to the specific crystal axis in the substrate plane produced using a sapphire single crystal substrate as a seed substrate. However, because neither GaAs nor sapphire is a group III nitride, a group III nitride single crystal substrates produced using a GaAs single crystal substrate or a sapphire single crystal substrate as a seed substrate is disadvantageous in their crystal quality. Recently, since a higher quality single crystal is desired, a group III nitride single crystal substrate, which is produced using a group III nitride single crystal as a seed substrate and has improved radii of curvature of both the crystal lattice plane and the main face and has an improved flatness of the back face of the substrate, has been proposed (see Patent Literature 5).

CITATION LIST

Patent Literature

Patent Literature 1: JP 2016-094337 A
Patent Literature 2: JP 3581145 B
Patent Literature 3: JP 5093127 B
Patent Literature 4: JP 2019-112266 A
Patent Literature 5: JP 2018-078260 A

SUMMARY

Technical Problem

Thus, a group III nitride single crystal substrate used for the production of group III nitride semiconductor devices can be obtained by a process including, in the sequence set forth: growing a group III nitride single crystal layer by a known crystal growth method over a seed substrate; separating the group III nitride single crystal layer from the seed substrate if necessary; and polishing the surface of the group III nitride single crystal layer and the back face of the group III nitride single crystal layer or of the seed substrate. Use of a group III nitride single crystal substrate having an improved radius of curvature of the crystal lattice plane, an improved radius of curvature of the main face, and improved surface roughness of the back face of the substrate offers production of a group III nitride semiconductor light-emitting device over the substrate with reduced variation in performance and improved output performance.

However, studies by the present inventor revealed that even when a group III nitride single crystal substrate is produced in accordance with the above methods, the radius of curvature of the crystal lattice plane and the radius of curvature of the main face vary depending on production batches, and thus a group III nitride single crystal substrate having a smaller radius of curvature of the crystal lattice plane and/or a smaller radius of curvature of the main face may be obtained. Such a substrate suffers an increased variance of the off-angle distribution in the group III nitride single crystal substrate surface, and is therefore not suitable as a substrate for fabricating a group III nitride semiconductor light emitting device. Further, when the present inventor produced a group III nitride semiconductor layer using such a group III nitride single crystal substrate, a phenomenon that the group III nitride semiconductor layer over the group III nitride single crystal substrate caused lattice relaxation forming dislocations in the group III nitride semiconductor layer, resulting in a significantly greater number of dislocations included in the group III nitride semiconductor layer than that in the group III nitride single crystal substrate, was observed sporadically.

An object of the present invention is to provide a high-quality group III nitride single crystal suitable for growing an aluminum-based group III nitride semiconductor device layer such as a high-performance light-emitting device or a high-performance electronic device, and providing a production method thereof.

Solution to Problem

The present inventor first measured an X-ray rocking curve and a dislocation density of the group III nitride single crystal substrate which had a smaller radius of curvature of the crystal lattice plane and/or a smaller radius of curvature of the main face and which was obtained due to variations in the radius of curvature of the crystal lattice plane and in the radius of curvature of the main face of the group III nitride single crystal substrate. However, the X-ray rocking curve half-width and the dislocation density of each of the measured substrates were not such values that interfere with device performances, but as good as those of well-made articles. From this result, it was found that variations in the radius of curvature is not caused when producing a group III nitride single crystal by a crystal growth method.

The present inventor next investigated the cause of the occurrence of lattice relaxation in the group III nitride semiconductor layer, to find that the occurrence of lattice relaxation is affected by the crystal arrangement in the vicinity of the surface of the group III nitride single crystal substrate, and that when a group III nitride semiconductor layer is grown over a group III nitride single crystal substrate whose crystal arrangement in the vicinity of the substrate surface is highly uniform, the occurrence of lattice relaxation in the group III nitride semiconductor layer is suppressed. Such a group III nitride single crystal substrate with highly uniform crystal arrangement was found to have a $1/1000$ intensity width of the X-ray rocking curve of the low-angle incident plane of the main face being no more than a specific value.

The present inventor then investigated a production method of a group III nitride single crystal substrate which can suppress the occurrence of lattice relaxation in the group III nitride semiconductor layer. The present inventor focused on the fact that after producing a group III nitride single crystal by a crystal growth method, grinding and polishing of a growth surface are performed so as to smoothen the growth surface, and studied in detail methods of these processes. Patent Literature 5 describes obtaining a group III nitride single crystal substrate, by processing both a main face and a back face of the group III nitride single crystal by grinding and polishing in combination. Processing method described in Patent Literature 5 mainly focuses on the surface roughness of the growth surface (i.e., the main face) of the group III nitride single crystal substrate and the surface roughness of the back face opposite to the main face of the group III nitride single crystal substrate. Studies by the present inventor revealed that in the processing method described in Patent Literature 5, while intended surface roughness can be achieved for the surface roughness of the main face and the back face of the substrate without problems, the resulting group III nitride single crystal substrate may suffer variations in the radii of curvature of the crystal lattice plane and the substrate surface.

Based on the above findings, the present inventor focused on a polished state of the main face and the back face of the group III nitride single crystal substrate after polishing processing in the method described in Patent Literature 5. In particular, the present inventor focused on the state of the group III nitride single crystal right before the back face side of the substrate is polished, and investigated in detail the surface states of the main face and the back face before and after the polishing by X-ray rocking curve measurement, to find that making a ratio of peak widths of X-ray rocking curves of a low-index diffraction plane parallel to the main face on the main face and the back face right before carrying out a final polishing finishing within a specific range, and thereafter carrying out the polishing until the $1/1000$ intensity width of the X-ray rocking curve of the low-angle incident plane of the main face becomes within a specific range, make it possible to obtain a group III nitride single crystal substrate with improved curvature radii of both the crystal lattice plane and the main face in a stable manner, and to suppress lattice relaxation in the group III nitride semiconductor layer when it is grown over the group III nitride single crystal substrate.

The present invention encompasses embodiments of [1] to [11] below.

[1] A group III nitride single crystal substrate comprising:
a first main face; and
a first back face opposite to the first main face,
wherein an absolute value of a radius of curvature of the first main face of the substrate is no less than 10 m;
an absolute value of a radius of curvature of a crystal lattice plane at a center of the first main face of the substrate is no less than 10 m; and
a $1/1000$ intensity width of an X-ray rocking curve of a low-angle incident plane at the center of the first main face of the substrate is no more than 1200 arcsec.

[2] The group III nitride single crystal substrate according to [1],
wherein the absolute value of the radius of curvature of the first main face of the substrate is no less than 15 m.

[3] The group III nitride single crystal substrate according to [1] or [2],
wherein the absolute value of the radius of curvature of the crystal lattice plane at the center of the first main face of the substrate is no less than 15 m.

[4] The group III nitride single crystal substrate according to any one of [1] to [3],
wherein the $1/1000$ intensity width of the X-ray rocking curve of the low-angle incident plane at the center of the first main face of the substrate is no more than 1000 arcsec.

[5] The group III nitride single crystal substrate according to any one of [1] to [4],
wherein in a plan view from the first main face side of the group III nitride single crystal substrate, the absolute value of the radius of curvature of the crystal lattice plane is no less than 10 m in the entire first main face; and
the $1/1000$ intensity width of the X-ray rocking curve of the low-angle incident plane in the entire first main face of the substrate is no more than 1200 arcsec.

[6] The group III nitride single crystal substrate according to any one of [1] to [5],
wherein the main face of the group III nitride single crystal substrate is a (001) plane, and the low-angle incident plane at the center of the main face of the substrate is a (103) plane.

[7] The group III nitride single crystal substrate according to any one of [1] to [6], which is a group III nitride single crystal layered body comprising:
a group III nitride single crystal base substrate comprising a second main face and a second back face opposite to the second main face; and
a group III nitride single crystal layer arranged over the second main face of the group III nitride single crystal base substrate, wherein the group III nitride of the group III nitride single crystal layer is the same as the group III nitride of the base substrate.

[8] The group III nitride single crystal substrate according to any one of [1] to [7],
wherein the group III nitride single crystal is an aluminum nitride single crystal.

[9] The group III nitride single crystal substrate according to [8],
wherein the first main face is an aluminum-polar face.

[10] A method for producing a group III nitride single crystal substrate, the method comprising, in the sequence set forth:
(1) preparing a group III nitride single crystal, wherein the group III nitride single crystal comprises a first main face and a first back face opposite to the first main face;
(2) grinding a surface of the first main face and a surface of the first back face of the group III nitride single crystal obtained in the (1); and
(3) polishing the surface of the first main face and the surface of the first back face of the group III nitride single crystal obtained in the (2),
the (3) comprising, in the sequence set forth:
(3-1) carrying out the polishing such that a ratio $w_{main}/w_{back}$ becomes 0.5 to 10, to obtain a group III nitride single crystal precursor substrate, wherein the $w_{main}$ is a $1/1000$ intensity width of an X-ray rocking curve of a low-index diffraction plane parallel to the first main face at a center of the first main face of the group III nitride single crystal, and wherein the $w_{back}$ is a $1/1000$ intensity width of an X-ray rocking curve of the low-index diffraction plane parallel to the first main face at a center of the first back face of the single crystal; and
(3-2) carrying out the polishing such that a $1/1000$ intensity width of an X-ray rocking curve of a low-angle incident plane at the center of the first main face of the group III nitride single crystal precursor substrate obtained in the (3-1) becomes no more than 1200 arcsec.

[11] The method for producing the group III nitride single crystal substrate according to [10],
the (1) comprising:
depositing a group III nitride single crystal layer over a group III nitride single crystal base substrate by a vapor phase growth method, wherein the base substrate comprises a second main face and a second back face opposite to the second main face, and wherein the group III nitride single crystal layer is deposited over the second main face of the base substrate, and wherein the group III nitride of the group III nitride single crystal layer is the same as the group III nitride of the base substrate.

Advantageous Effects of Invention

The X-ray rocking curve of the low-angle incident plane of the group III nitride single crystal substrate of the present invention has a $1/1000$ intensity width within a specific range. The $1/1000$ intensity width indicates the degree of order of the crystal arrangement in the vicinity of the surface of the group III nitride single crystal substrate. That is, in the group III nitride single crystal substrate of the present invention, which has a small value of the $1/1000$ intensity width, the crystal arrangement in the vicinity of the substrate surface is close to a perfect crystal, and the dislocation density is small. Further, the group III nitride single crystal substrate of the present invention has a large radius of curvature of the main face, and, a large radius of curvature of the crystal lattice plane at the center of the main face. This offers reduction in variance of the off-angle in the substrate surface, making it possible to increase the stability of the quality and yield of a group III nitride semiconductor device such as a light emitting device and an electronic device which are fabricated over the group III nitride single crystal substrate. Further, the group III nitride single crystal substrate of the present invention also offers suppression of lattice relaxation when growing a group III nitride semiconductor device layer on the group III nitride single crystal substrate, making it possible to reduce variance in performance of the group III nitride semiconductor device and to increase the yield of the group III nitride semiconductor device.

BRIEF DESCRIPTION OF DRAWINGS

FIG. 6 schematically illustrates the relationship between the coordinates of 2n+1 measurement points on a straight line passing through the center of the main face and the peak diffraction angle of the X-ray rocking curve of the low-index diffraction plane parallel to the main face, referring to the substrate 30.

DESCRIPTION OF EMBODIMENTS

Figure 1:
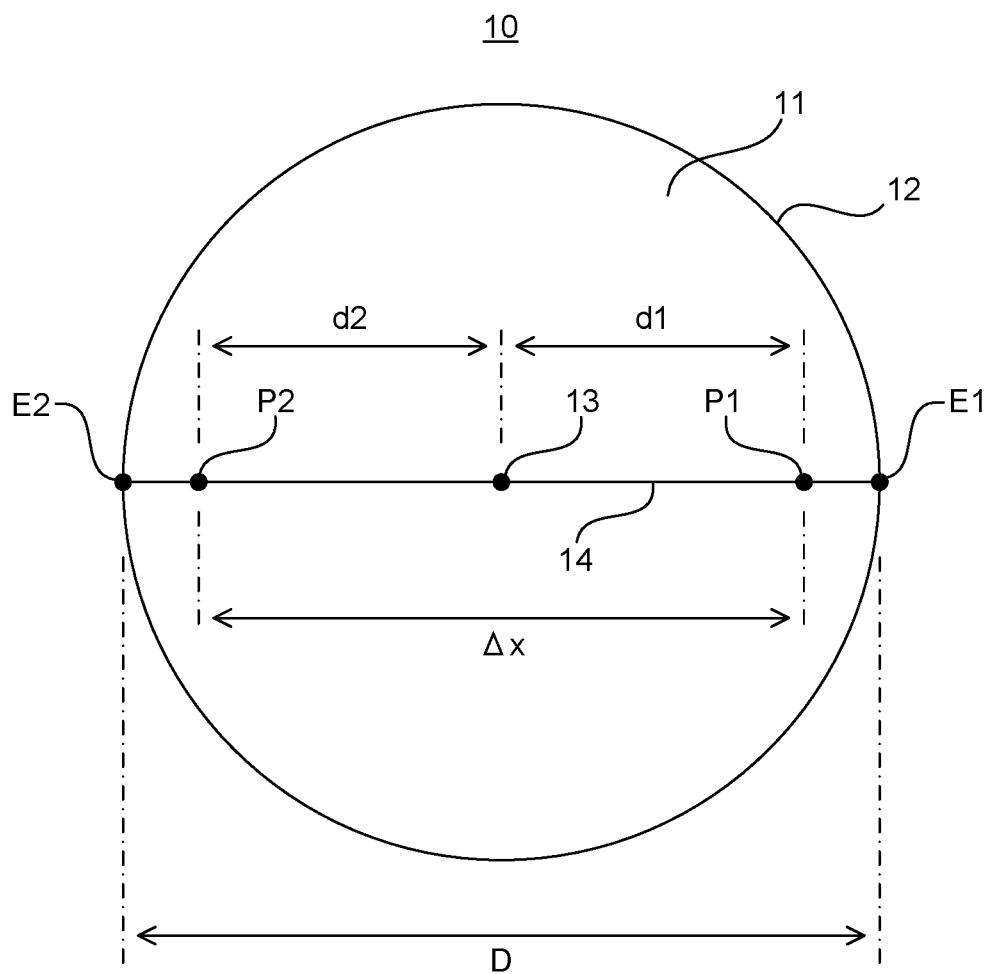
FIG. 1 is a plan view of a group III nitride single crystal substrate 10 according to one embodiment to explain how to choose a straight line passing through the center of the main face and two points on the straight line when the main face of the substrate has a circular shape.

Hereinafter, embodiments of the present invention will be described in further detail with reference to the accompanying drawings. However, the present invention is not limited to these embodiments. The drawings do not necessarily reflect accurate dimensions. Some reference signs may be omitted in the drawings. In the present description, an expression "A to B" concerning numeral values A and B means "no less than A and no more than B" unless otherwise specified. If a unit is added only to the numeral value B in such an expression, the same unit shall be applied to the numeral value A as well. A word "or" means a logical sum unless otherwise specified. An expression "$E_1$ and/or $E_2$" concerning elements $E_1$ and $E_2$ means "$E_1$ or $E_2$ or any combination thereof", and an expression "$E_1, \ldots, E_{N-1}$, and/or $E_N$" (N is an integer of 3 or more) means "$E_1, \ldots, E_{N-1}$, or $E_N$, or any combination thereof". In the present description, the term "group III" for an element is intended to mean group 13 elements of the periodic table. In the present description, the term "X-ray rocking curve" means "X-ray omega (ω) rocking curve". In the present description, the term "half width" means the full width at half maximum unless otherwise specified.

<1. Group III Nitride Single Crystal Substrate>

A group III nitride single crystal substrate of the present invention (hereinafter may be referred to as a "group III nitride single crystal substrate" or simply a "substrate") is a group III nitride single crystal substrate which comprises a first main face and a back face opposite to the first main face, wherein an absolute value of a radius of curvature of the first main face of the substrate is 10 m or more, an absolute value of a radius of curvature of a crystal lattice plane at a center of the first main face of the substrate is 10 m or more, and a $1/1000$ intensity width of an X-ray rocking curve of a low-angle incident plane at the center of the first main face of the substrate is 1200 arcsec or less. Depositing a group III nitride semiconductor layer which is to serve as a device over such a group III nitride single crystal substrate makes it possible to increase the stability of the quality and yield of a group III nitride semiconductor device to be fabricated such as a light emitting device and an electronic device. In the present description, the "low-angle incident plane" means a diffraction plane such that an X-ray incident angle to the surface is 12° or less.

In the present description, the main face (first main face) of the group III nitride single crystal substrate is a surface of the group III nitride single crystal substrate over which a group III nitride semiconductor layer which is to serve as a device is deposited, and is also referred to as a crystal growth surface. The group III nitride single crystal substrate further comprises a back face opposite to the main face.

In one embodiment, the group III nitride single crystal substrate of the present invention may be a group III nitride single crystal layered body comprising a base substrate and a group III nitride single crystal layer arranged over the base substrate, wherein the base substrate comprises a main face (second main face), and wherein the group III nitride single crystal layer is arranged over the main face (second main face) of the base substrate. In this case, the main face of the group III nitride single crystal layer is the main face (first main face) of the group III nitride single crystal substrate, and the back face (second back face) of the base substrate is the back face (first back face) of the group III nitride single crystal substrate.

The growth face of the group III nitride single crystal substrate may be any of c-plane ((001) plane), a-plane ((110) plane), or m-plane ((100) plane). When the growth face of the group III nitride single crystal substrate is c-plane, the low-index diffraction plane parallel to the main face is (002) plane, and the low-angle incident plane is (103) plane. When the growth face of the group III nitride single crystal substrate is a-plane, the low-index diffraction plane parallel to the main face is (110) plane, and the low-angle incident plane is (114) plane. When the growth face of the group III nitride single crystal substrate is m-plane, the low-index diffraction plane parallel to the main face is (100) plane, and the low-angle incident plane is (106) plane. The state of the substrate satisfying the requirements for X-ray rocking curves of the low-angle incident plane as defined in the present invention, preferably further satisfying the requirements for X-ray rocking curves of the low-index diffraction plane parallel to the main face, offers provision of a high-quality group III nitride single crystal substrate suitable for growing a group III nitride semiconductor device layer to fabricate a semiconductor device such as a high-performance light-emitting device and electronic device, without being affected by the face index of the growth face of the group III nitride single crystal substrate.

The growth face of the group III nitride single crystal substrate, i.e., the main face, is preferably c-plane ((001) plane), in view of easily obtaining a group III nitride single crystal substrate having a large diameter.

When the group III nitride single crystal substrate is a layered body comprising an base substrate and a group III nitride single crystal layer, it is enough if the radius of curvature of the main face of the group III nitride single crystal layer arranged over the base substrate, and the radius of curvature of the crystal lattice plane at the center of the main face, and the 1/1000 intensity width of the X-ray rocking curve of the low-angle incident plane at the center of the main face satisfy the above range.

In the present description, the center of the main face of the group III nitride single crystal substrate is defined as follows. If the shape of the main face has rotational symmetry, the center of the main face shall be the position of the axis of rotational symmetry of the main face. Examples of shapes with rotational symmetry include circles and regular polygons (e.g., regular hexagons, etc.). In one embodiment, the shape of the group III nitride single crystal substrate may be a circle or a regular polygon, or a partially distorted circle or a partially distorted regular polygon. Examples of partially distorted circles and partially distorted regular polygons include partially notched circles and partially notched regular polygons. Examples of the notch comprised in the main face (that is, a notch comprised in a substrate) include an orientation flat, etc.

If the main face has a partially distorted circular shape and does not have rotational symmetry, the center of the main face shall be the center of the original circle. The original circle can be found as the circle whose periphery has the longest total overlap with the periphery of the main face. The center of the original circle also can be found as the intersection of two longest straight lines which can be drawn from the periphery of the main face to the opposite periphery of the main face.

If the main face has a partially distorted regular polygonal shape and does not have rotational symmetry, the center of the main face shall be the center of the original regular polygon. The original regular polygon can be found as the regular polygon whose periphery has the longest total overlap with the periphery of the main face.

In the present description, the "entire the main face" of the group III nitride single crystal substrate mean the entire main face observed from above the center of the main face (i.e., a plan view) when the substrate is placed on a horizontal (i.e., perpendicular to the vertical direction) plane. Although the side face of the substrate may be seen on the outer peripheral side of the outer periphery of the main face in the plan view, the side face of the substrate shall not be included in the "entire main face".

Examples of the group III nitride constituting the group III nitride single crystal substrate include known group III nitrides such as gallium nitride (GaN), aluminum nitride (AlN), and aluminum gallium nitride (AlGaN). The group III nitride single crystal substrate of the present invention is preferably a, GaN single crystal substrate or an AlN single crystal substrate since they are useful in the production of light emitting devices, and is particularly preferably an AlN single crystal substrate since it is useful as a substrate to produce a deep ultraviolet light emitting diode.

If the group III nitride single crystal substrate of the present invention is a layered body comprising a group III nitride single crystal base substrate and a group III nitride single crystal layer arranged over the base substrate, the group III nitride constituting the base substrate is preferably the same the group III nitride as that constituting the group III nitride single crystal layer arranged over the base substrate. Conventionally, a group III nitride single crystal layered body has been produced by depositing a group III nitride single crystal layer by epitaxial growth over the base substrate. Heteroepitaxial growth, in which a single crystal layer of a group III nitride different from that of the base substrate is grown over the base substrate, suffer not only formation of many dislocations in the grown group III single crystal growth layer, but also tendency for residual strain to accumulate in the group III nitride single crystal layer itself, due to the differences in lattice constants and thermal expansion coefficients between the base substrate and the group III nitride single crystal layer. When residual strain accumulates in the group III nitride single crystal layer, the radius of curvature of the main face and/or the radius of curvature of crystal lattice plane of the resulting layered body (group III nitride single crystal substrate) tend(s) to deteriorate. In contrast, homoepitaxial growth, in which a single crystal layer of the same group III nitride as that of the base substrate is grown over the base substrate, is favorable in that it does not suffer differences in lattice constants and thermal expansion coefficients between the group III nitride single crystal layer to be grown and the base substrate, and thus the group III nitride single crystal layer can grow inheriting the crystal quality of the base substrate, making it possible to obtain a high-quality group III nitride single crystal.

A group III nitride single crystal substrate has a group III element-polar face and a nitrogen-polar face. For example, when the group III nitride is AN, the group III element-polar face is an aluminum-polar face. The main face of the group III nitride single crystal substrate of the present invention may be a group III element-polar face, or may be a nitrogen-polar face. However, in view of obtaining a surface having a step terrace structure suitable for device fabrication, the main face of the group III nitride single crystal substrate is preferably a group III element-polar face (e.g., aluminum-polar face when the group III nitride is AlN).

Although the face orientation of the main face of the group III nitride single crystal substrate is not particularly limited, the present invention is particularly advantageous when the main face of the group III nitride single crystal substrate is c-plane, m-plane, or a-plane. When the main face is a c-plane, the main face may be a group III element-polar face (hereinafter may be referred to as a "+c-plane"), or may be a nitrogen-polar face (hereinafter may be referred to as a "−c-plane").

When a group III nitride single crystal substrate is placed on a horizontal plane such that the crystal growth surface faces vertically upward, the substrate may be convex-shaped upward (i.e., the crystal growth surface is convex-shaped), or may be convex-shaped downward (i.e., the crystal growth surface is concave-shaped). In the present description, the radius of curvature of the main face and the crystal lattice plane of the group III nitride single crystal substrate shall have a positive sign when the face/plane is convex-shaped upward, and a negative sign when the face/plane is convex-shaped downward. The absolute value of the radius of curvature of the main face (first main face) of the group III nitride single crystal substrate of the present invention is 10 m or more, and the absolute value of the radius of curvature of the crystal lattice plane at the center of the main face (first main face) of the substrate is 10 m or more. A larger absolute value of the radius of curvature of the main face of the group III nitride single crystal substrate, and a larger absolute value of the radius of curvature of the crystal lattice plane at the center of the main face of the substrate, mean less curvatures and thus are favorable, irrespective of whether they are positive values or negative values. It is noted, though, in view of efficiency of industrial production, at least one of the absolute values of the radii of curvature described above is preferably 15 m or more, and particularly preferably 20 m or more. Although the absolute value of the radius of curvature of the main face of the group III nitride single crystal substrate can be increased by precisely performing a polishing process step described later, it is preferably no more than 1000 m, or no more than 300 m, or no more than 200 m, in view of industrial productivity. The upper limit of the absolute value of the radius of curvature of the crystal lattice plane at the center of the main face of the group III nitride single crystal substrate is usually about 300 m or less, although it depends on crystal growth conditions.

Further, in view of contributing to the stabilization of the quality and yield of a group III nitride semiconductor device to be fabricated such as a light emitting device or an electronic device, the absolute value of the radius of curvature of the crystal lattice plane in the entire main face in a plan view from the side of the main face (first main face) of the group III nitride single crystal substrate is particularly preferably 10 m or more.

Figure 2:
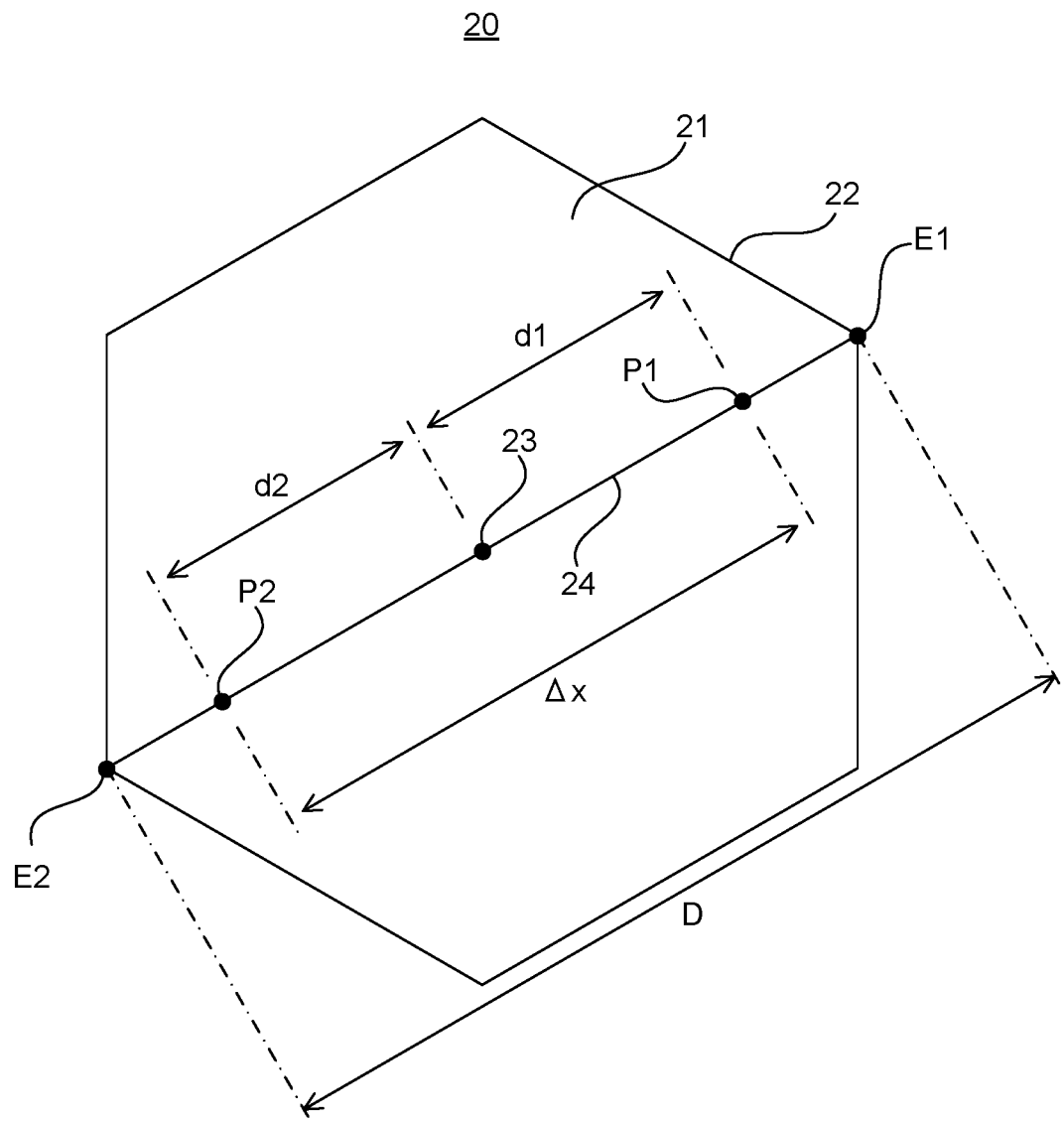
FIG. 2 is a plan view of a group III nitride single crystal substrate 20 according to one embodiment to explain how to choose a straight line passing through the center of the main face and two points on the straight line when the main face of the substrate has a regular polygonal shape.
Figure 3:
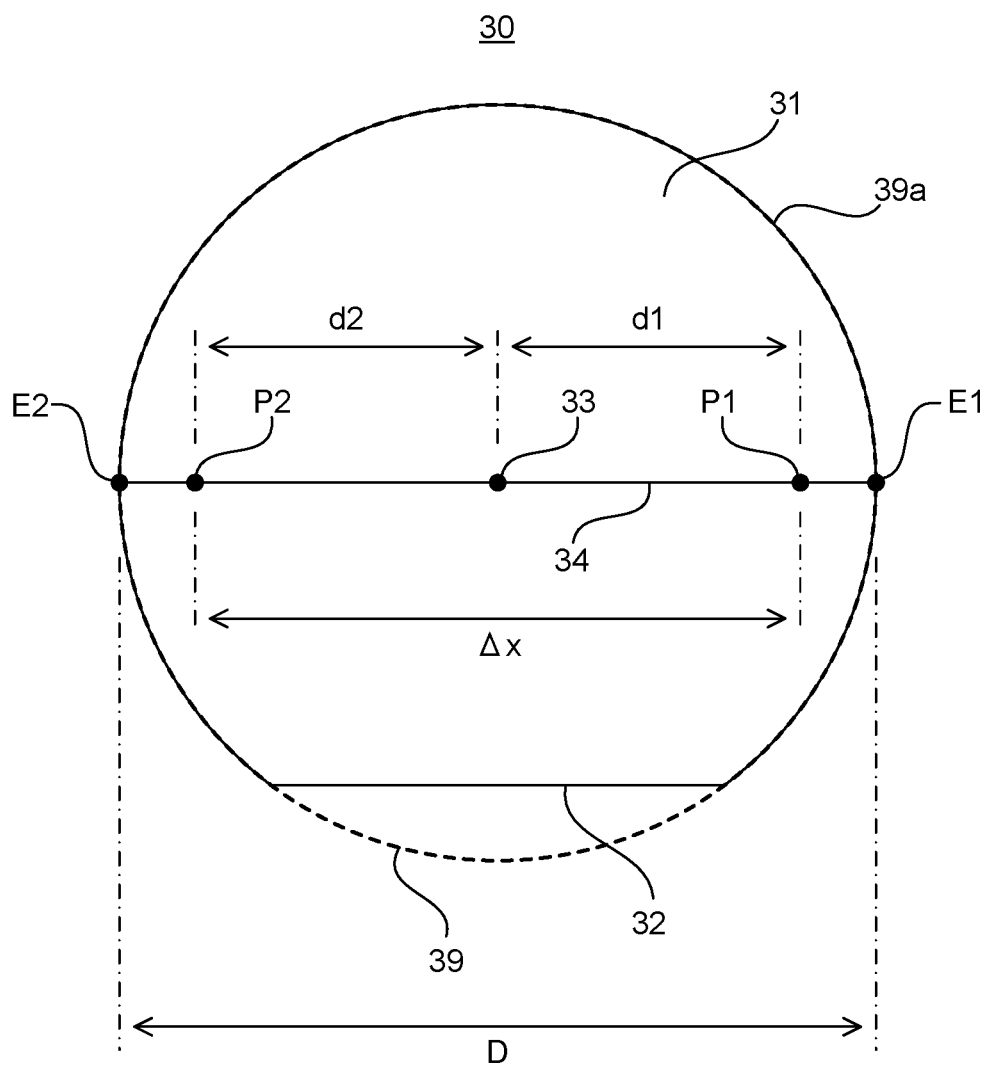
FIG. 3 is a plan view of a group III nitride single crystal substrate 30 according to one embodiment to explain how to choose a straight line passing through the center of the main face and two points on the straight line when the main face of the substrate has a partially distorted circular shape.
Figure 4:
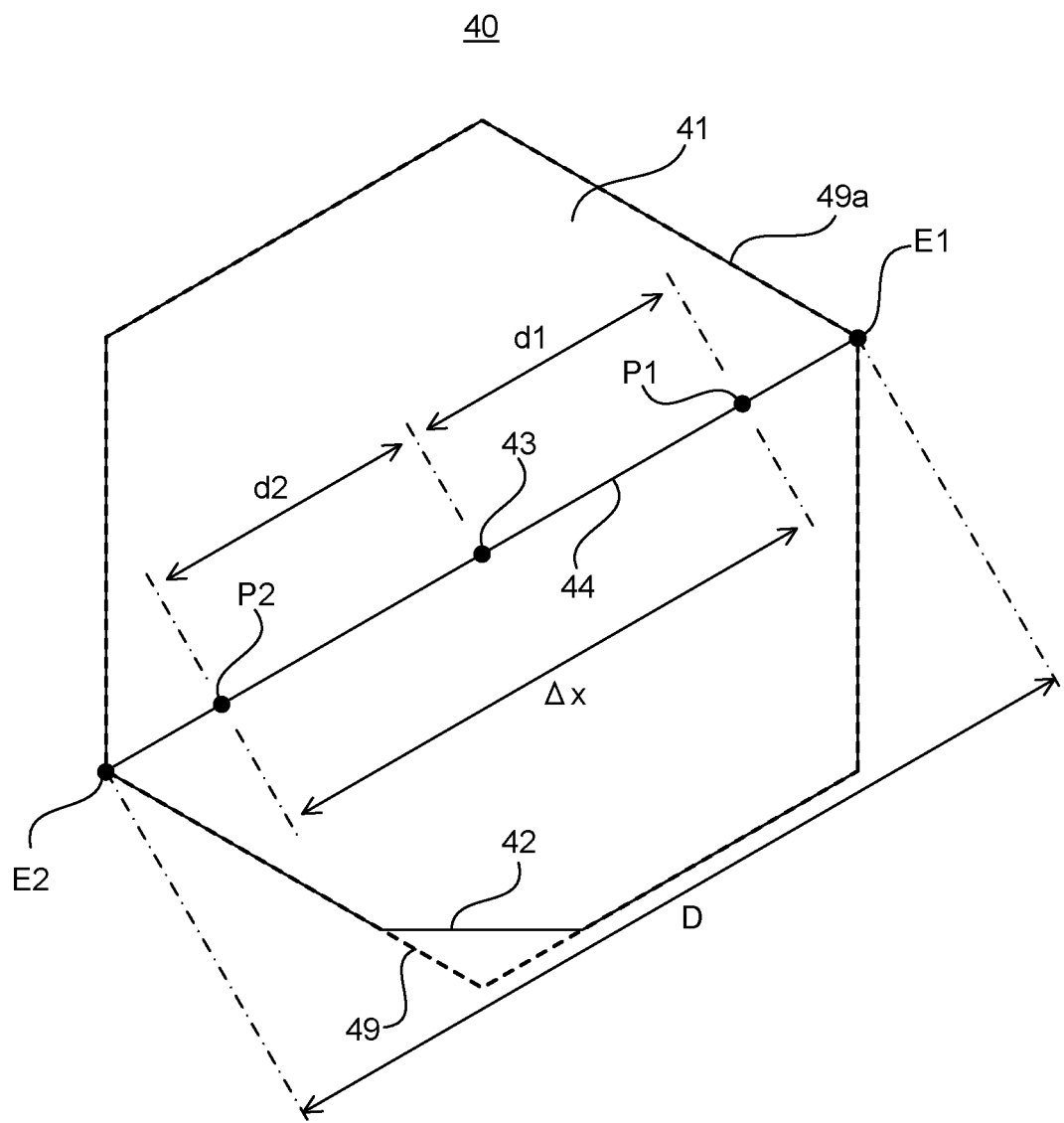
FIG. 4 is a plan view of a group III nitride single crystal substrate 40 according to one embodiment to explain how to choose a straight line passing through the center of the main face and two points on the straight line when the main face of the substrate has a partially distorted regular polygonal shape.

The radius of curvature of the crystal lattice plane of the group III nitride single crystal substrate can be determined by the following method. That is, the radius of curvature of the crystal lattice plane of the substrate is calculated from peak diffraction angles of X-ray rocking curves of the low-index diffraction plane parallel to the main face measured at different two points in the main face of the substrate. Specifically, the X-ray rocking curve is measured at two different points in the main face of the substrate using a thin film X-ray diffractometer. From the distance $\Delta x$ (unit: m) between the two points and the difference $\Delta \omega$ (unit: rad) of the peak diffraction angle between the two points, the radius of curvature R (unit: m) is calculated by the formula: $\Delta x/\Delta \omega$. The radius of curvature of the crystal lattice plane at the center of the main face of the substrate is calculated by the formula $\Delta x/\Delta \omega$, based on the measurement results of the X-ray rocking curve at two points on a straight line passing through the center of the main face of the substrate as measurement points. FIG. 1 is a plan view of a group III nitride single crystal substrate 10 (hereinafter may be referred to as "substrate 10") according to one embodiment to explain how to choose a straight line through the center of the main face and two points on the straight line when the main face of the substrate is circular-shaped. Substrate 10 has a main face 11, and the main face 11 comprises a periphery 12. The substrate 10 is a circular substrate, and the main face 11 is circular-shaped. Since the shape of the main face 11 has a rotational symmetry, the position of the center 13 of the main face 11 is the position of the axis of rotation symmetry of the main face 11. FIG. 2 is a plan view of a group III nitride single crystal substrate 20 (hereinafter may be referred to as "substrate 20") according to one embodiment to explain how to choose a straight line through the center of the main face and two points on the straight line when the main face of the substrate is a regular polygon. The substrate 20 comprises a main face 21, and the main face 21 comprises a periphery 22. The substrate 20 is a regular hexagonal substrate, and the shape of the main face 21 is a regular hexagon. Since the shape of the main face 21 has a rotational symmetry, the position of the center 23 of the main face 21 is the position of the axis of rotation symmetry of the main face 21. FIG. 3 is a plan view of a group III nitride single crystal substrate 30 according to one embodiment (hereinafter may be referred to as "substrate 30") to explain how to choose a straight line through the center of the main face and two points on the straight line when the main face of the substrate is a partially distorted circle. The substrate 30 comprises a main face 31, and the main face 31 comprises a periphery 32. The substrate 30 comprises an orientation flat, i.e., the substrate 30 is a circular substrate which is partly cut out, and the shape of the main face 31 is a partially distorted circle. Since the shape of the main face 31 is partially distorted from a circle, it has no rotational symmetry. The "original circle" 39 of the main face 31 can be found as a circle 39 whose periphery has the longest total overlap 39a with the periphery 32 of the main face 31. The center 33 of the original circle 39 is the center of the main face 31. FIG. 4 is a plan view of a group III nitride single crystal substrate 40 according to one embodiment (hereinafter may be referred to as "substrate 40") to explain how to select a straight line through the center of the main face and two points on the straight line when the main face of the substrate is a partially distorted polygon. The substrate 40 comprises a main face 41, and the main face 41 comprises a periphery 42. The substrate 40 comprises an orientation flat, i.e., the substrate 40 is a regular hexagonal substrate which is partly cut out, and the shape of the main face 41 is a partially distorted regular hexagon. Since the shape of the main face 41 is partially distorted from a regular hexagon, it has no rotational symmetry. The "original regular hexagon" 49 of the main face 41 can be found as a regular hexagon 49 whose periphery has the longest total overlap 49a with the periphery 42 of the main face 41. The center 43 of the original hexagon 49 is the center of the main face 41. Hereinafter, explanations will be given referring to the substrates 10, 20, 30, and 40 as examples. The straight line passing through the center of the main face of the substrate (14 (FIG. 1), 24 (FIG. 2), 34 (FIG. 3), 44 (FIG. 4)) is chosen such that the length D of the straight line is maximized, i.e., such that the distance D between the first intersection E1 and the second intersection E2 is maximized, wherein the first and second intersections E1 and D2 are two intersections of the straight line with the periphery of and the main face. If there are a plurality of candidates for such a straight line, there will be no significant difference in the measurement results whatever candidate is chosen. For example, when the substrate is a disc-shaped substrate having one orientation flat (see FIG. 3.), a straight line parallel to the notch of the orientation flat can be chosen as the straight line passing through the center of the main face (34). When determining the radius of curvature of the crystal lattice plane at the center of the main face, the first measurement point P1 and the second measurement point P2 which are two points on the straight line passing through the center of the main face are chosen such that the first and second measurement points P1 and P2 are symmetrical with respect to the center of the main face (13 (FIG. 1), 23 (FIG. 2), 33 (FIG. 3), 43 (FIG. 4) (i.e., the distance d1 and d2 from the center of the main face are equal (d1=d2)). The distance Δx (=d1+d2) between two points on a straight line passing through the center of the main face is taken to be sufficiently long or the longest, as far as the crystal quality at these two points are not greatly different from the crystal quality at the center of the main face, i.e., as far as the half widths of the X-ray rocking curve of the low-index diffraction plane parallel to the main face at these two points are less than twice as large as the half width of the X-ray rocking curve of the low-index diffraction plane at the center of the main face. Such two points can be chosen in positions which are by no less than 2 mm distant from the intersections of the straight line with the periphery of the main face (i.e., the first measurement point P1 is in a position which is by no less than 2 mm distant from the first intersection E1, and the second measurement point P2 is in a position which is by no less than 2 mm distant from the second intersection E2), such that the distance Δx between these two points is 70 to 85% of the length D of the straight line passing through the center of the main face. As long as the distance Δx between these two points is within the range of 70-85% of the length D of the straight line passing through the center of the main face, there will be no significant difference in the measurement results. Based on the radius of curvature calculated from the measurement results of the X-ray rocking curve of the low-index diffraction plane parallel to the main face at two points sufficiently separated and symmetrically arranged about the center of the main face ("radius of curvature of the crystal lattice plane at the center of the main face"), it is possible to evaluate the average radius of curvature of the crystal lattice plane of the entire substrate face.

The radius of curvature of the crystal lattice plane in the entire the main face of the substrate can be measured by the following procedures 1) to 5).

1) A straight line passing through the center of the main face of the substrate is arranged in the main face of the group III nitride single crystal substrate. As the "straight line passing through the center of the main face", the same straight line as the "straight line passing through the center of the main face" used for the measurement of the "radius of curvature of the crystal lattice plane at the center of the main face" is used.

Figure 5:
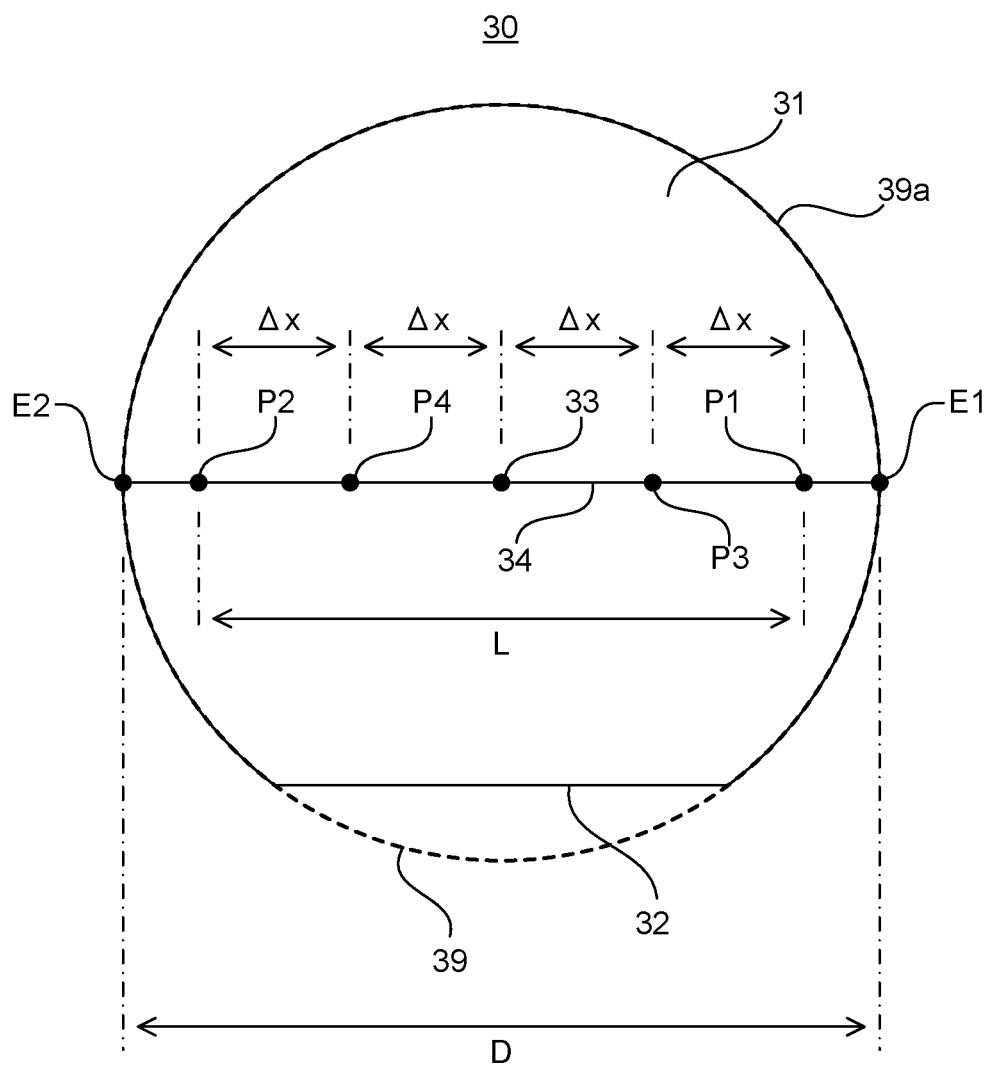
FIG. 5 is a plan view schematically illustrating the arrangement of measurement points used for measurement of the "radius of curvature of the crystal lattice plane in the entire the main face" of the substrate 30.

2) On the straight line passing through the center of the main face set in the 1), equally spaced 2n+1 measurement points (n is an integer of 2 or more) are arranged symmetrically about the center of the main face. The measurement points on the straight line comprise the center of the main face, and are equally spaced apart with a spacing of no less than 5 mm. Since 2n+1 measurement points are arranged symmetrically about the center of the main face, n measurement points are arranged along the straight line on each side of the center of the main face. The outermost two measurement points are chosen in positions which are by no less than 2 mm distant from the intersection of the straight line with the periphery of the main face, such that the distance between these outermost two measurement points is 70 to 85% of the length D of the straight line passing through the center of the main face. Hereinafter, explanations will be given with reference to the substrate 30 as an example, but the present procedure is applicable to any substrate other than the substrate 30. FIG. 5 is a plan view schematically illustrating the arrangement of measurement points used for measurement of the "radius of curvature of the crystal lattice plane in the entire main face" of the substrate 30. FIG. 5 shows five (i.e., n=2) measurement points P1, P2, P3, P4, and (the center) 33. These 5 measurement points are arranged on a straight line 34 passing through the center 33 of the main face. The straight line 34 is the same as the straight line 34 used for the measurement of the radius of curvature of the "crystal lattice plane at the center of the main face" described above. These 5 measurement points (P1, P2, P3, P4, and (the center) 33) on the straight line 34 comprise the center 33 of the main face and are equally spaced with an interval Δx of no less than 5 mm. The outermost two measurement points P1 and P2 are chosen in positions which are by no less than 2 mm distant from the intersections E1 and E2 of the straight line 34 with the periphery of the main face respectively, such that the distance L between the outermost two measurement points P1 and P2 is 70 to 85% of the length D of the straight line 34 passing through the center of the main face.

3) The X-ray rocking curve of the low index diffraction plane parallel to the main face is measured for the 2n+1 measurement points arranged in the 2).

4) For each pair of two adjacent measurement points (e.g., in FIG. 5, the pair of P1 and P3, the pair of P3 and the center 33, the pair of centers 33 and P4, and the pair of P4 and P2), a radius of curvature is calculated by the formula: Δx/Δω based on the distance Δx between the two points (unit: m) and the difference Δu) (unit: rad) of the peak diffraction angle of X-ray rocking curve at the two points obtained in the 3).

5) The minimum value among the 2n values of the radius of curvature obtained in the 4) is the "radius of curvature of the crystal lattice plane in the entire main face of the substrate".

The radius of curvature calculated for each pair of two adjacent measurement points in the 4) evaluates a local radius of curvature in the substrate plane of the crystal lattice plane. Since their minimum value is taken in the 5), the "radius of curvature of the crystal lattice plane in the entire main face of the substrate" evaluates the worst value of the radius of curvature of the crystal lattice plane over the entire main face.

The group III nitride single crystal substrate preferably has a small in-plane variance of the radius of curvature of the crystal lattice plane in the main face. The in-plane variance of the radius of curvature of the crystal lattice plane can be evaluated by means of a square ($R^2$) of a correlation coefficient between a coordinate on the straight line passing through the center of the main face of the substrate and a peak diffraction angle of the X-ray rocking curve of the low index diffraction plane parallel to a main face as an index. The in-plane variance of the radius of curvature of the crystal lattice plane in the main face can be specifically evaluated by the following procedures 1) to 5).

1) A straight line passing through the center of the main face is arranged in the main face of the group III nitride single crystal substrate. As the "straight line passing through the center of the main face", the same straight line as the "straight line passing through the center of the main face" used for the measurement of the "radius of curvature of the crystal lattice plane at the center of the main face" is used.

2) On the straight line passing through the center of the main face arranged in the 1), equally spaced 2n+1 measurement points (n is an integer of 2 or more) are arranged symmetrically about the center of the main face. Arrangement of the 2n+1 measuring points is carried out in the same manner as in the 2) of the procedure described above for the measurement method of the "radius of curvature of the crystal lattice plane in the entire main face of the substrate".

3) For the 2n+1 measurement points arranged in the 2), the X-ray rocking curve of the low-index diffraction plane parallel to the main face of the group III nitride single crystal is measured. Measurement of the X-ray rocking curve is carried out such that the beam of the incident X-ray overlaps the straight line arranged in the 1) in a plan view of the substrate. Further, the measurements of the X-ray rocking curve at the 2n+1 measurement points are carried out such that the incident angle of the X-ray to the ideal main face of the group III nitride single crystal substrate (i.e., the imaginary main face which is assumed to be perfectly flat (i.e., the radius of curvature of the main face is assumed to be infinite)) in the X-ray diffraction apparatus is identical for all measurement points. That is, while it is necessary to change the measurement point on the substrate 2n times using the same X-ray diffraction apparatus in order to measure the X-ray rocking curve for 2n+1 measurement points, the change of the measurement point on the substrate in the X-ray diffraction apparatus is carried out either by translating the group III nitride single crystal substrate while keeping the same direction and the same spatial position of the X-ray beam, or by translating the X-ray beam while the group III nitride single crystal substrate is fixed.

4) For the 2n+1 measurement points, the coordinate (unit: mm) is assigned on the straight line arranged in 1). Although the way in which the coordinate is taken on a straight line does not affect the resulting $R^2$, it can be taken, for example, such that the center of the main face is the origin. Although which side of the center of the main face takes a positive coordinate does not affect the value of the resulting $R^2$, for example, the side from which the X-ray is incoming in the 3) can be given a negative sign.

5) For the above 2n+1 measurement points, a correlation coefficient R between the coordinate (unit: mm) assigned in the 4) and the peak diffraction angle (unit: deg) of the X-ray rocking curve obtained in the 3) is calculated, and its square $R^2$ is calculated.

Figure 6A:
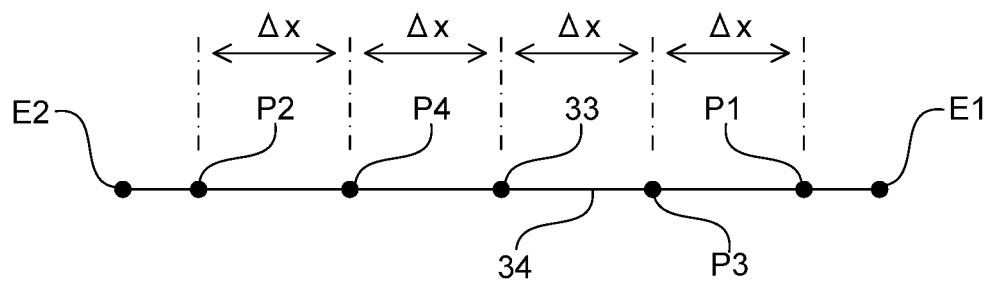
FIG. 6A is a diagram that extracts a straight line 34 and five measurement points from FIG. 5.
Figure 6B:
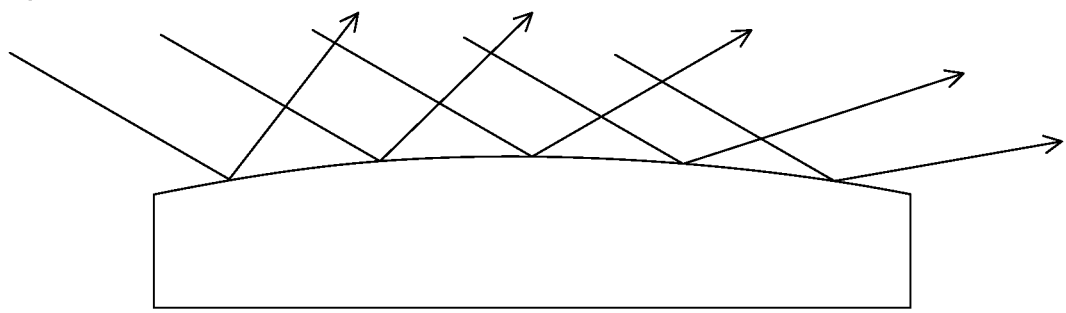
FIG. 6B is a diagram schematically illustrating a cross section obtained by cutting the substrate 30 in FIG. 3 with a straight line 34, and the incident X-ray and diffracted X-rays to each measurement point (see each arrow).
Figure 6C:
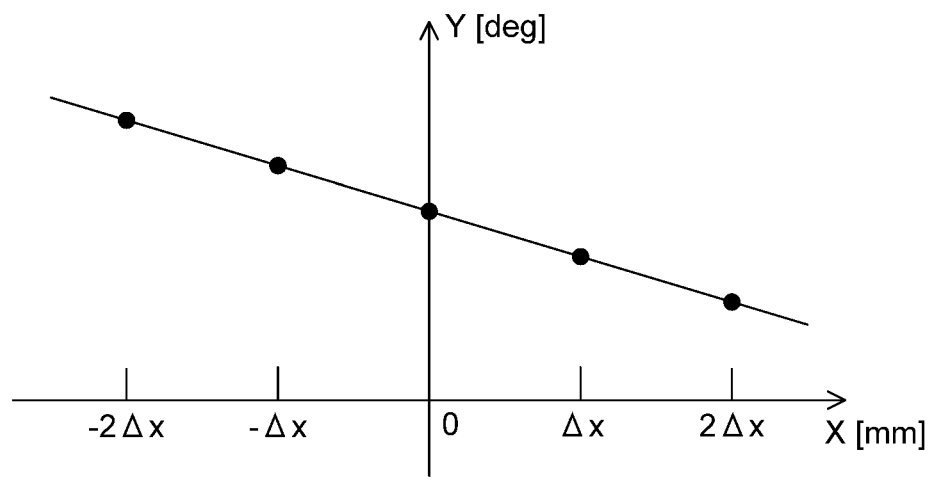
FIG. 6C is a diagram schematically illustrating the scatter diagram obtained by taking the coordinates of each measurement point on the straight line along the horizontal axis (X-axis) and taking the peak diffraction angle of the X-ray rocking curve measured for each measurement point along the vertical axis (Y-axis), and a regression line obtained by the least squares method taking the coordinates of the measurement points and an independent variable and the peak diffraction angle as a dependent variable.

Hereinafter, explanations will be given with reference to the substrate 30 as an example, but the present procedure is applicable to any substrate other than the substrate 30. FIG. 6 is a diagram schematically illustrating the relationship between the coordinates of 2n+1 measurement points on the straight line and the peak diffraction angle of the X-ray rocking curve of the low index diffraction plane parallel to the main face, referring to the substrate 30 as an example. FIG. 6A is a view in which the straight line 34 and five measurement points are extracted from FIG. 5. FIG. 6B is a diagram schematically illustrating a cross section obtained by cutting the substrate 30 by the straight line 34 in FIG. 3, and X-rays incident to and diffracted from each measurement point (see each arrow). FIG. 6C is a diagram schematically illustrating the scatter diagram obtained by taking the coordinates on the straight line of each measurement point along the horizontal axis (X-axis) and taking the peak diffraction angle of the X-ray rocking curve measured for each measurement point along the vertical axis (Y-axis), and a regression line obtained by the least squares method taking the coordinates of the measurement point as an independent variable and taking the peak diffraction angle as a dependent variable. The smaller the variance of the radius of curvature in the plane is, the closer the square $R^2$ of the correlation coefficient is to 1. That is, the smaller the variance of the radius of curvature in the plane is, the better fitting of a linear regression line obtained by the least squares method (see FIG. 6C) taking the coordinates of the 2n+1 measurement points as the independent variable and taking the peak diffraction angle of the X-ray rocking curve of the low index diffraction plane parallel to the main face as the dependent variable is obtained. $R^2$ is preferably no less than 0.92, and more preferably no less than 0.98.

The radius of curvature of the main face of the substrate is calculated from the height distribution of the main face measured using a white-light interference microscope and the size of the main face based on the assumption that the surface shape of the main face can be approximated as a spherical shape.

The radius of curvature of the main face of the substrate can be measured specifically by the following procedures 1) to 4).

1) Using a white-light interference microscope, information on the height distribution of the entire area of the main face which is by no less than 2 mm distant from the periphery of the main face is acquired under the condition that magnification of the objective lens is 1 to 10 times.

2) Based on the information of the in-plane height distribution acquired in the 1), the parameter $C_0$ to $C_5$ in the following formula (1) which represents the height Z as a function of the in-plane coordinates (X, Y) in the plane is determined by the nonlinear least-squares fitting taking the in-plane coordinates (X, Y) as independent variables and taking the height Z as a dependent variable:

$$Z(X,Y)=C_0+C_1X+C_2Y+C_3XY+C_4X^2+C_5Y^2 \qquad (1)$$

Although the way of taking the in-plane coordinates in the plane (directions of the X-axis and Y-axis, and the position of the origin) does not affect the result, for example, the center of the main face can be taken as the origin. Calculation of the nonlinear least squares fitting can be carried out by means of a known method such as Gauss-Newton method, a gradient method (e.g., BFGS method, L-BFGS method, a conjugate gradient method, etc.), or a confidence region method (e.g., Levenberg-Marquardt method, etc.).

3) The deflection S is calculated by the following formula (2) using $C_4$ and $C_5$ of the parameters $C_0$ to $C_5$ determined in the 2):

$$S=-\tfrac{1}{2}(C_4+C_5)r^2 \qquad (2)$$

wherein in the formula (2), r is an in-plane distance between the center of the main face and the measurement point most distant from the center of the main face.

4) Using the deflection S calculated in the 3), the radius of curvature $R_{CRV}$ of the main face is calculated by the following formula (3) based on the spherical approximation:

$$R_{CRV} = \frac{r^2}{2S} \qquad (3)$$

wherein in formula (3), r is as defined in the formula (2).

The measurement and calculation of the 1) to 4) explained above can be performed, for example, automatically by means of a white-light interference microscope NewView™ 7300 from Zygo Corporation.

The group III nitride single crystal substrate of the present invention has a 1/1000 intensity width of the rocking curve of the low-angle incident plane at the center of the main face of the substrate of 1200 arcsec or less.

When the main face of the group III nitride single crystal substrate (growth face) is c-plane, the low-angle incident plane is (103) plane. During measurement of the X-ray rocking curve of the (103) plane of the substrate whose main face is c-plane, the X-ray comes into the group III nitride single crystal at a shallow incidence angle of about 1.38° to the substrate surface. In addition, observing the $1/1000$ intensity width of the rocking curve of the (103) plane means observing tails of the diffraction peak of the X-ray. Therefore, the $1/1000$ intensity width of the rocking curve of the (103) plane gives information about the crystal arrangement in the vicinity of the surface of the group III nitride single crystal substrate. Similarly, when the main face (growth face) is a-plane or m-plane, the $1/1000$ intensity width of the X-ray rocking curve of the low-angle incident plane gives information about the crystal arrangement in the vicinity of the surface of the group III nitride single crystal substrate. When the main face (growth face) is a-plane, i.e., (110) plane, the low-angle incident plane is (114) plane. When the main face (growth face) is m-plane, i.e., (100) plane, the low-angle incident plane is (106) plane. The $1/1000$ intensity width of the X-ray rocking curve of the low-angle incident plane at the center of the main face within the above range means that high uniformity of the crystal arrangement in the vicinity of the surface of the group III nitride single crystal substrate, which makes it possible to significantly reduce the risk of lattice relaxation and latent damage caused in a group III nitride semiconductor layer when it is grown over the group III nitride single crystal substrate. Calculation of the $1/1000$ intensity width of the rocking curve can be performed by a procedure similar to that of the half width. That is, with the background level of the rocking curve subtracted (i.e., with a baseline drawn), the strongest diffraction intensity of the rocking curve is measured, and the diffraction angle width of the rocking curve corresponding to $1/1000$ of the intensity is determined.

In one embodiment, the $1/1000$ intensity width of the X-ray rocking curve of the low-angle incident plane in the entire main face of the group III nitride single crystal substrate is preferably 1200 arcsec or less. The $1/1000$ intensity width of the X-ray rocking curve of the low-angle incident plane in the entire main face of the substrate can be measured by the following procedure 1) to 3).

Figure 7:
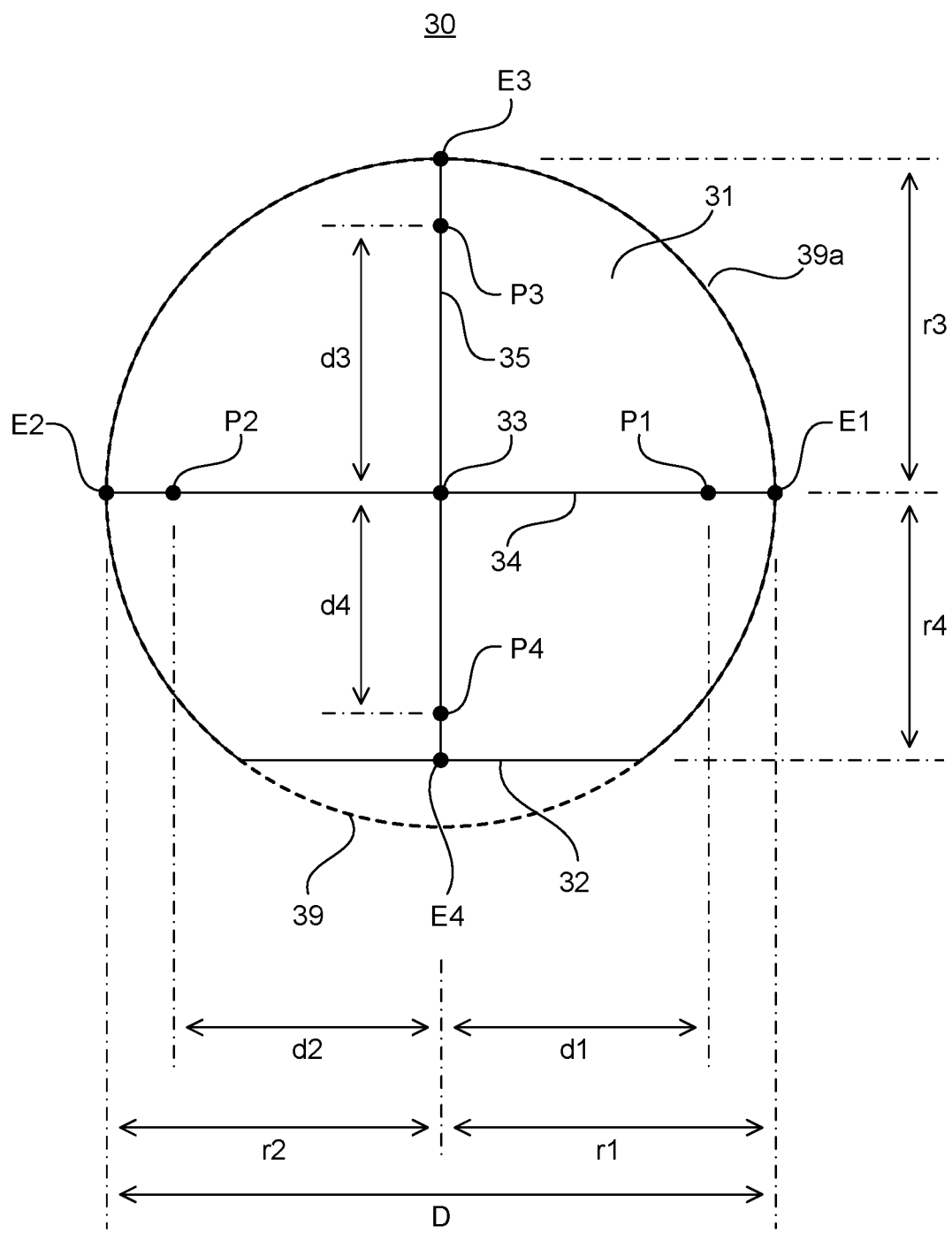
FIG. 7 is a plan view schematically illustrating the arrangement of measurement points in the measurement of the "$1/1000$ intensity width of the X-ray rocking curve of the low-angle incident plane in the entire main face" of the substrate 30.

1) Four or more measurement points are arranged in the main face of the substrate. Each measurement point is arranged in an area where the distance from the center of the substrate is 70 to 85% of the distance from the center of the main face to the periphery of the main face. That is, each measurement point is arranged on a line segment connecting the center of the main face and the periphery of the main face, such that the distance from the center of the main face to the measurement point is 70 to 85% of the length of the line segment. Hereinafter, explanations will be given with reference to the substrate 30 as an example, but the present procedure is applicable to any substrate other than the substrate 30. FIG. 7 is a plan view schematically illustrating the arrangement of measurement points for the measurement of "$1/1000$ intensity width of the X-ray rocking curve of the low-angle incident plane in the entire main face" of the substrate 30. The first measurement point (P1) and the second measurement point (P2) are arranged on the first straight line (34) passing through the center (33) of the main face. The first straight line (34) is chosen such that the distance D (=r1+r2) between two intersections (E1, E2) of the first straight line (34) and the periphery of the main face becomes longest. If there are a plurality of candidates for such a straight line, there will be no significant difference in the measurement results whichever candidate is chosen. For example, when the substrate is a disc-shaped substrate having one orientation flat (see FIG. 7), a straight line parallel to the notch of the orientation flat can be chosen as the first straight line (34) passing through the center of the main face. Two intersections of the first straight line (34) and the periphery of the main face are defined as the first intersection (E1) and the second intersection (E2), respectively. The first measurement point (P1) is arranged in a position between the center (33) of the main face and the first intersection (E1), such that the distance (d1) from the center (33) to the first measurement point is 70 to 85% of the distance (r1) between the center (33) and the first intersection (E1). The second measurement point (P2) is arranged in a position between the center (33) of the main face and the second intersection (E2), such that the distance (d2) from the center (33) to the second measurement point is 70 to 85% of the distance (r2) between the center (33) and the second intersection (E2). As such first and second measurement points, two measurement points P1 and P2 described above in relation to the "radius of curvature of the crystal lattice plane at the center of the main face of the substrate" (see FIG. 3) can be employed. The third measurement point (P3) and the fourth measurement point (P4) are arranged on a second straight line (35) which is orthogonal to the first straight line (34) at the center of the main face (33). Two intersections of the second straight line (35) and the periphery of the main face are defined as, the third intersection (E3) and the fourth intersection (E4), respectively. The third measurement point (P3) is arranged in a position between the center (33) and the third intersection (E3), such that the distance (d3) from the center (33) to the third measurement point is 70 to 85% of the distance between the center (33) and the third intersection (E3). The fourth measurement point (P4) is arranged in a position between the center (33) and the fourth intersection (E4), such that the distance (d4) from the center (33) to the fourth measurement point is 70 to 85% of the distance between the center (33) and the fourth intersection (E4). Optionally, the fifth or further additional measurement points may be further arranged. Each of the fifth or further additional measurement points is also arranged on a line segment connecting the center of the main face and the periphery of the main face, such that the distance from the center is 70 to 85% of the length of the line segment.

2) The $1/1000$ intensity width of the X-ray rocking curve of the low-angle incident plane is measured for each measurement point arranged in the 1). Measurement of the $1/1000$ intensity width of the X-ray rocking curve of the low-angle incident plane can be carried out in the same manner as described above for the "$1/1000$ intensity width of the rocking curve of the low-angle incident plane at the center of the main face".

3) The maximum value among the values of the $1/1000$ intensity width of the X-ray rocking curve of the low-angle incident plane obtained in the 2) is the "$1/1000$ intensity width of the X-ray rocking curve of the low-angle incident plane in the entire main face".

The "$1/1000$ intensity width of the X-ray rocking curve of the low-angle incident plane in the entire main face" being 1200 arcsec or less means high uniformity of the crystal arrangement in the vicinity of the surface of the group III nitride single crystal substrate over the entire main face, which is advantageous in in reducing the risk of lattice relaxation and latent damage caused in generated in a group III nitride semiconductor layer when it is grown over the group III nitride single crystal substrate.

Latent damage means hidden damage derived from a deep polishing scratch which is generated in the slicing or grinding or lapping process of a group III nitride single crystal and which remains in the vicinity of the substrate surface, failing to be removed even after CMP, or damage which is minute unevenness present on the surface (minute surface roughness) and is thus difficult to detect by non-destructive inspection means such as an optical microscope. Latent damage is difficult to detect, for example, even by means of a Nomarski differential interference microscope. In many cases, latent damage reveals its presence by growth of a convex-shaped surface morphology called hillock which is continuous in a line from the position of the latent damage when a group III nitride semiconductor layer is grown over the group III nitride single crystal substrate.

In view of contributing to stabilization of the quality and yield of a fabricated group III nitride semiconductor crystal such as a light emitting device and an electronic device, the $1/1000$ intensity width of the X-ray rocking curve of the low-angle incident plane is preferably no more than 1000 arcsec, and more preferably no more than 850 arcsec. Although a smaller value of the $1/1000$ intensity width is favorable, the resolution is limited by the measurement device and the measuring conditions, and thus the $1/1000$ intensity width may be, for example, 10 arcsec or more.

In view of contributing to the stabilization of the quality and yield of a fabricated group III nitride semiconductor crystal such as a light emitting device and an electronic device, the $1/1000$ intensity width of the X-ray rocking curve of the low-angle incident plane in the entire main face of the group III nitride single crystal substrate is particularly preferably 1200 arcsec or less.

Figure 8:
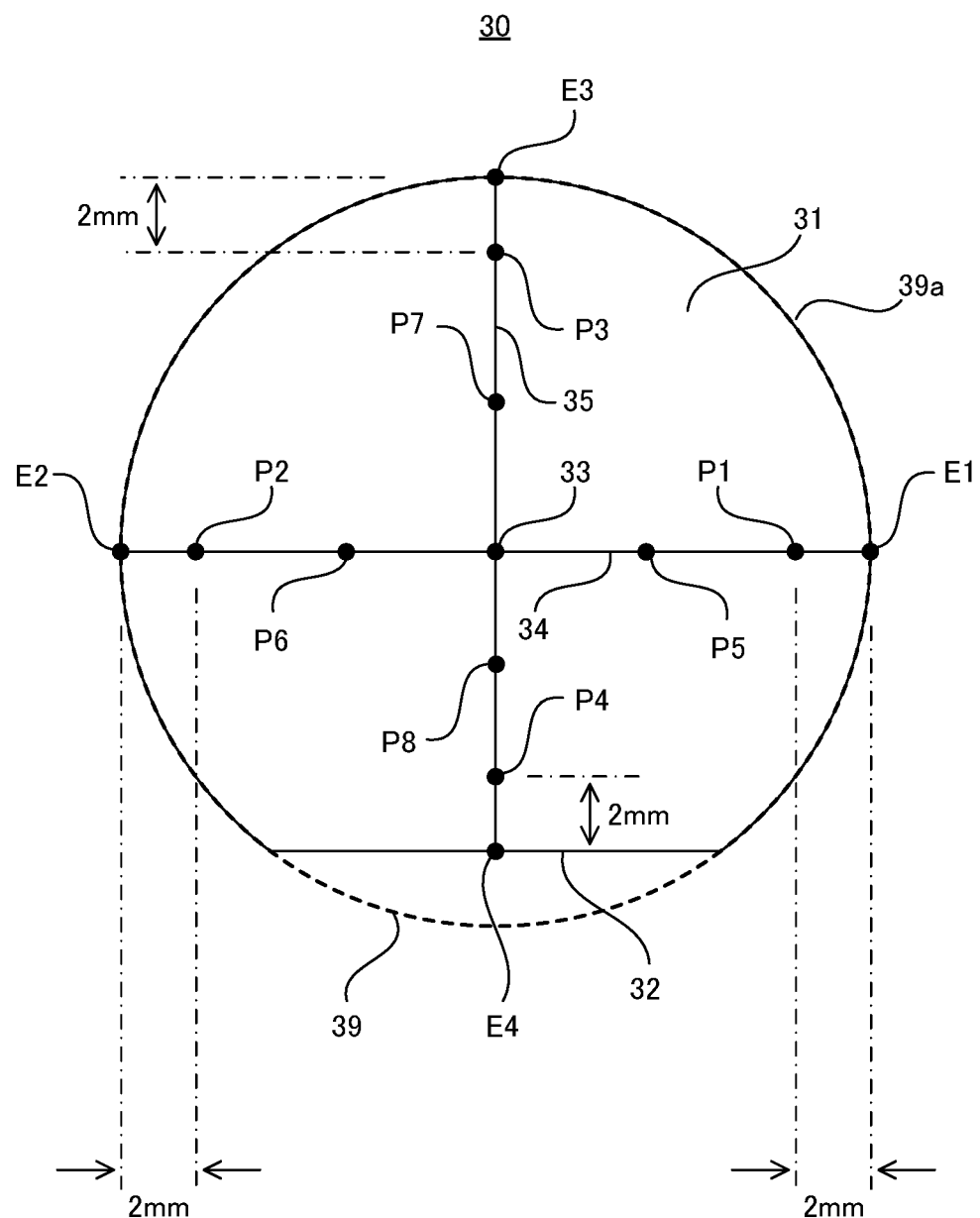
FIG. 8 is a plan view schematically illustrating the arrangement of measurement points in the evaluation of the TTV of the substrate 30.

The thickness of the group III nitride single crystal substrate can be appropriately determined, as long as cracks due to insufficiency of strength do not occur in each step disclosed in the present description or in the step of growing a device layer over the group III nitride single crystal substrate. The thickness of the group III nitride single crystal substrate may be, for example, 50 to 2000 μm, preferably from 100 to 1000 μm. In view of suppressing variance in performance of the device layer formed over the substrate, it is preferable that the variation in thickness in the group III nitride single crystal substrate is small. Variation in the thickness of the substrate can be evaluated by TTV (Total Thickness Variation). TTV is preferably no more than 30 μm, more preferably no more than 20 μm, and particularly preferably no more than 10 μm. The ideal value for the thickness variation is 0 μm, which means that there is no thickness variation. TTV means the difference calculated by subtracting the minimum thickness from the back face of the substrate from the maximum thickness from the back face of the substrate, and is an index indicating the thickness unevenness in a semiconductor wafer. It thus appears necessary to measure the thickness of the substrate over the entire face of the substrate in order to measure the TTV, but considering the features of the production method of the substrate which will be described later (single crystal growth method), the thickness value obtained by measuring the thickness of the substrate at a plurality of points and subtracting the minimum value of the measurement results from the maximum value of the measurement results can be regarded as the TTV. In the present description, evaluation of TTV of a group III nitride single crystal substrate can be carried out, for example, by the following procedure 1) to 7). Hereinafter, explanations will be given with reference to the substrate 30 as an example, but the present procedure is applicable to any substrate other than the substrate 30. FIG. 8 is a plan view schematically illustrating the arrangement of measurement points for evaluation of the TTV of the substrate 30.

1) A first straight line (34) passing through the center (33) of the substrate is arranged. The first straight line (34) is chosen such that the distance between two intersections (E1, E2) of the first straight line (34) and the periphery of the main face becomes longest. If there are a plurality of candidates for such a straight line, there will be no significant difference in the measurement results whichever candidate is chosen. For example, when the substrate is a disc-shaped substrate having one orientation flat (see FIG. 7.), a straight line parallel to the notch of the orientation flat can be chosen as the first straight line passing through the center of the main face (34). Two intersections of the first straight line (34) and the periphery of the main face are defined as the first intersection (E1) and the second intersection (E2), respectively.

2) The first and second measurement points (P1, P2) are arranged on the first straight line (34). The first measurement point (P1) is arranged in a position which is between the center (33) of the substrate and the first intersection (E1) and which is by 2 mm inward from the first intersection (E1) toward the center (33). The second measurement point (P2) is arranged in a position which is between the center (33) of the substrate and the second intersection (E2) and which is by 2 mm inward from the second intersection (E2) toward the center (33).

3) A second straight line (35) orthogonal to the first straight line (34) at the center (33) of the substrate is arranged. Two intersections of the second straight line (35) and the periphery of the substrate are defined as the third intersection (E3) and the fourth intersection (E4), respectively.

4) The third and fourth measurement points (P3, P4) are arranged on the second straight line (35). The third measurement point P3 is arranged in a position which is between the center of the substrate (33) and the third intersection (E3), and which is by 2 mm inward from the third intersection (E3) toward the center (33). The fourth measurement point (P4) is arranged in a position which is between the center (33) of the substrate and the second intersection (E2), and which is by 2 mm inward from the fourth intersection (E4) toward the center (33).

5) A fifth measurement point (P5) is arranged at a midpoint between the center (33) of the substrate and the first measurement point (P1); a sixth measurement point (P6) is arranged at a midpoint between the center (33) of the substrate and the second measurement point (P2); a seventh measurement point (P7) is arranged at a midpoint between the center (33) of the substrate and the third measurement point (P3); and an eighth measurement point (P8) is arranged at a midpoint between the center (33) of the substrate and the fourth measurement point (P4).

6) The thickness of the substrate is measured at a total of nine points, namely the first to eighth measurement points (P1 to P8) and the center of the substrate (33).

7) The difference between the maximum and the minimum of the measurement values at the 9 measurement points obtained in the 6) can be regarded as TTV. In evaluating the TTV, the thickness of the substrate can be measured by means of a contact-type micrometer, or a non-contact-type laser distance meter (e.g., spectral-interference displacement meter SI-F series from Keyence Corporation).

In view of obtaining a high-quality device layer over a group III nitride single crystal substrate, the surface of the main face of the group III nitride single crystal substrate is preferably flat, and the surface roughness Ra (arithmetic average roughness) measured by observing a 4 µm² (2 µm×2 µm) field of view of the main face by atomic force microscopy (AFM) is preferably about 0.1 nm or less. In view of growing a device layer comprising a quantum well structure, it is more favorable that the surface of the main face is in a condition in which a step terrace structure (that is, a structure in which an atomic step can be confirmed) can be observed. The surface roughness of the back face can be evaluated by means of a white-light interference microscope. Heating of the substrate in a crystal growth apparatus for growing a device over a group III nitride single crystal substrate is generally performed at a high temperature which exceeds 1000° C. Since the influence of radiant heat transfer to the substrate is large under such high temperature conditions, an evaluation method of analyzing white light is suitable as an evaluation method for managing the surface roughness of the back face. The surface roughness Ra of the back face measured by the white-light interference microscope under the condition of magnification of the objective lens of 50 times is preferably no more than 100 nm, more preferably no more than 5 nm, and particularly preferably no more than 2 nm. The surface roughness Ra of the main face measured by the white-light interference microscope is preferably no more than 0.8 nm, and more preferably no more than 0.55 nm. As the measurement points of the surface roughness Ra, for example, the 2n+1 measurement points described above in connection with the measurement of the "radius of curvature of the crystal lattice plane in the entire main face of the substrate" (see FIG. 5) can be employed. The surface roughness of the entire face can be evaluated by taking the arithmetic average value of the values of the surface roughness Ra obtained for the 2n+1 points.

Dislocation density in the main face of the group III nitride single crystal substrate is preferably no more than $10^6$ cm$^{-2}$, more preferably no more than $10^5$ cm$^{-2}$, and particularly preferably no more than $10^4$ cm$^{-2}$. Further, it is preferable that the difference in the dislocation density between the main face and the back face of the group III nitride single crystal substrate is small, and it is preferable that they are substantially at the same level. Specifically, the ratio of the dislocation density of the back face to the dislocation density of the main face (back face/main face) is preferably within a range of 1/5 to 5. It is noted that the term "dislocation density" in the present description means a dislocation density measured by an etch pit density method. Reflecting the small dislocation density described above, the half-width of the X-ray rocking curve of the low-index diffraction plane parallel to the main face of the group III nitride single crystal substrate of the present invention (i.e., (002) plane when the main face is c-plane, (110) plane when the main face is a-plane, and (100) plane when the main face is m-plane) is preferably no more than 70 arcsec, and more preferably no more than 40 arcsec. In addition, the half width of the X-ray rocking curve of the asymmetric diffraction plane to the main face (i.e., (101) plane when the main face is c-plane, (111) plane when the main face is a-plane, and (201) plane when the main face is m-plane) is preferably no more than 50 arcsec, and more preferably no more than 20 arcsec. Further, it is preferable that the difference between the half width of the X-ray rocking curve of the main face and that of the back face of the group III nitride single crystal substrate is small, the ratio (back face/main face) of the X-ray rocking curve half width of the back face to the X-ray rocking curve half width of the main face is preferably within the range of 1/2 to 2, for the low-index diffraction plane parallel to the main face as well as for the asymmetric diffraction plane to the main face. That is, the ratio (back face/main face) of the X-ray rocking curve half width of the low-index diffraction plane parallel to the main face measured for the center of the back face to the X-ray rocking curve half width of the low-index diffraction plane measured for the center of the main face is preferably within the range of 1/2 to 2; and the ratio (back face/main face) of the X-ray rocking curve half width of the asymmetric diffraction plane to the main face measured for the center of the back face to the X-ray rocking curve half width of the asymmetric diffraction plane measured for the center of the main face is preferably within the range of 1/2 to 2.

The total concentration of impurities in the group III nitride single crystal substrate is preferably no more than $1 \times 10^{19}$ cm$^{-3}$, and more preferably no more than $5 \times 10^{17}$ cm$^{-3}$. Impurity concentrations in a group III nitride single-crystal substrate can be measured by secondary ion mass spectrometry (SIMS) for Si, O, Cl, B, and C, and can be measured by glow discharge mass spectrometry for metal elements which are not detected by secondary ion mass spectrometry. In the present description, the "total concentration of impurities" in a group III nitride single crystal substrate means a sum of concentrations of Si, O, Cl, B, and C measured by secondary ion mass spectrometry and concentrations of metal elements measured by glow discharge mass spectrometry. The absorption coefficient of the group III nitride single crystal substrate for an ultraviolet ray having a wavelength of 265 nm, which is used for ultraviolet sterilization, is preferably no more than 30 cm$^{-1}$, more preferably no more than 15 cm$^{-1}$, and particularly preferably no more than 10 cm$^{-1}$. The lower limit of the absorption coefficient is 0 cm$^{-1}$. In the present description, the term "absorption coefficient for an ultraviolet ray having a wavelength of 265 nm" means a corrected absorption coefficient $\alpha_{265}$ in the following equation (4) representing a linear light transmittance of a plate-shaped sample.

3

$$T_{265} = \frac{(1 - R_{265})^2 \exp(-\alpha_{265} x)}{1 - R_{265}^2 \exp(-2\alpha_{265} x)} \tag{4}$$

In the equation (4), $T_{265}$ represents a linear light transmittance at a wavelength of 265 nm; x represents a plate thickness (unit: cm); and $R_{265}$ represents a reflectance at a wavelength of 265 nm. In the present description, the value of the correction absorption coefficient £265 at a wavelength of 265 nm of an aluminum nitride single crystal shall be calculated by solving the equation (4) assuming R265=0.160. As regards thermal conductivity which is important in applications to electronic devices, the thermal conductivity of the group III nitride single crystal substrate is preferably no less than 300 W/m·K, and more preferably no less than 330 W/m·K.

Hereinafter, a method of producing a group III nitride single crystal substrate of the present invention will be described in detail.

<2. Method for Producing Group III Nitride Single Crystal Substrate>

Figure 9:
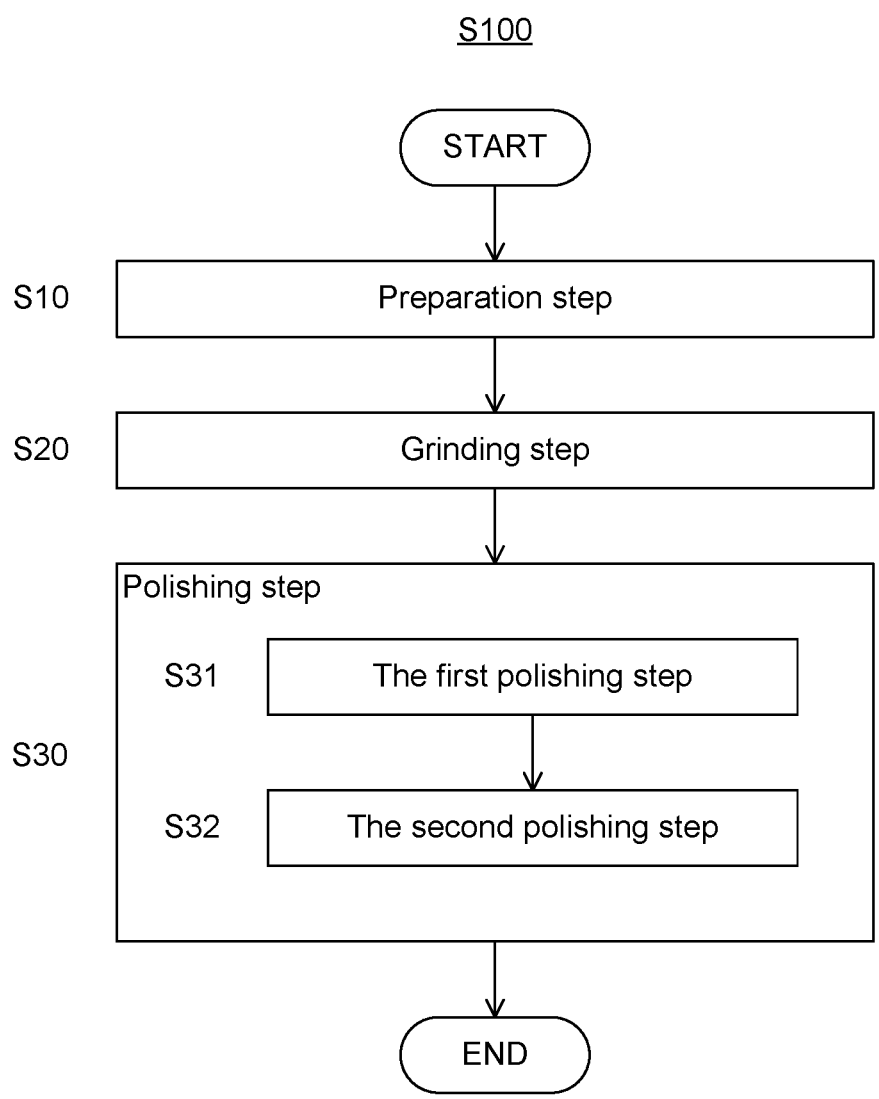
FIG. 9 is a flowchart illustrating a production method S100 of a group III nitride single crystal substrate according to one embodiment.

FIG. 9 is a flowchart illustrating a method S100 of producing a group III nitride single crystal substrate according to one embodiment of the present invention (hereinafter may be referred to as a "production method S100"). As shown in FIG. 9, the production method S100 comprises, in the sequence set forth:

(1) S10: preparing a group III nitride single crystal, wherein the group III nitride single crystal comprises a first main face and a first back face opposite to the first main face (hereinafter may be referred to as "preparation step S10");

(2) S20: grinding a surface of the first main face and a surface of the first back face of the group III nitride single crystal obtained in the (1) (preparation step S10) (hereinafter may be referred to as "grinding step S20"); and (3) S30: polishing the surface of the first main face and the surface of the first back face of the group III nitride single crystal obtained in the (2) (grinding step S20) (hereinafter may be referred to as "polishing step S30"), wherein the (3) (polishing step S30) comprises, in the sequence set forth:

(3-1) S31: carrying out the polishing such that a ratio $w_{main}/w_{back}$ $(=\delta_1)$ becomes 0.5 to 10, to obtain a group III nitride single crystal precursor substrate, wherein the $w_{main}$ is a $1/1000$ intensity width of an X-ray rocking curve of a low-index diffraction plane parallel to the first main face at a center of the first main face of the group III nitride single crystal, and wherein the $w_{back}$ is a $1/1000$ intensity width of an X-ray rocking curve of the low-index diffraction plane parallel to the first main face at a center of the first back face of the single crystal (hereinafter may be referred to as "first polishing step S31"); and (3-2) S32: carrying out the polishing such that a $1/1000$ intensity width of an X-ray rocking curve of a low-angle incident plane at the center of the first main face of the group III nitride single crystal precursor substrate obtained in the (3-1) becomes no more than 1200 arcsec (hereinafter may be referred to as "second polishing step S32"), Hereinafter, each step will be described.

((1) Preparation Step S10)

The preparation step S10 is a step of preparing a group III nitride single crystal, wherein the group III nitride single crystal comprises a first main face and a first back face opposite to the first main face. Although the group III nitride single crystal can be prepared by a known method, in view of obtaining a single crystal of a large diameter relatively easily, it is preferable to grow a group III nitride single crystal layer over a base substrate. The group III nitride single crystal layer can be grown by a known crystal growth method. Specifically, a vapor phase growth method such as sublimation method, physical vapor phase transport (PVT) method, metalorganic chemical vapor deposition (MOCVD) method, hydride vapor phase epitaxy (HVPE) method, etc.; or a liquid phase growth method such as ammonothermal method and flux method, can be employed. Among these growth methods, in view of being able to grow a group III nitride single crystal layer without deteriorating crystal quality of the base substrate such as dislocation density and defect density and in view of a relatively high growth rate of a single crystal which offers good productivity, a vapor phase growth method such as HVPE method or sublimation method, or a crystal growth method such as ammonothermal method can be preferably employed, and a vapor phase growth method can be particularly preferably employed.

(Base Substrate)

As the base substrate used in the preparation step S10, a base substrate over which a group III nitride single crystal layer can be grown can be used without particular limitation: a group III nitride single crystal base substrate may be used, or a heterologous substrate other than a group III nitride may be used as the base substrate. It is noted, though, in view of maintaining good crystal quality during growth of the group III nitride single crystal layer, it is preferable to use a group III nitride single crystal base substrate, and it is more preferred to use a group III nitride single crystal base substrate composed of the same group III nitride as that of the group III nitride single crystal layer to be grown. As described above, when a heterologous substrate is used as the base substrate, a strain or the like may be caused due to a difference in lattice constant and/or thermal expansion coefficient between the base substrate and the group III nitride single crystal layer grown over the base substrate, which may adversely affect the effect of the present invention, leading to failure to be sufficiently benefited from the effect of the present invention. Further, even if after growing the group III nitride single crystal layer over the base substrate which is a heterologous substrate, the group III nitride single crystal layer is separated from the base substrate to obtain a free-standing substrate consisting of the group III nitride single crystal, and a new group III nitride single crystal layer is grown over the free-standing substrate as a base substrate, the influence of strain or the like caused by growing the group III nitride single crystal layer over the heterologous substrate may still remain, although in small quantities. From such a viewpoint, a group III nitride single crystal obtained in a spontaneous nucleation environment, i.e., in an environment where a strain does not remain in the single crystal, is preferably used as the base substrate, and a free-standing substrate obtained by separating a group III nitride single crystal layer grown over the base substrate is preferably used as a new base substrate. It is further noted that the present invention is remarkably advantageous when an aluminum nitride single crystal is employed as the base substrate.

Dislocation density of the base substrate is preferably no more than $10^6$ cm$^{-2}$, more preferably no more than $10^5$ cm$^{-2}$, and further preferably no more than $10^4$ cm$^{-2}$. An occupied area ratio of (a) grain(s) (i.e., (a) region(s) which appear(s) on the base substrate surface and which has/have a crystal orientation different from that of the surroundings in the surface of the crystal growth surface) in the base substrate, i.e., the ratio of an area occupied by (a) grain region(s) in the effective crystal growth surface (i.e., the in-plane region of the crystal growth surface of the base substrate where the distance from the periphery of the base substrate is no less than 1 mm) is preferably no more than 20%, and more preferably no more than 5%. The thickness of the base substrate is preferably 50 to 2000 μm. The surface roughness of the main face which is a crystal growth surface of the base substrate is preferably 0.5 nm or less in terms of the surface roughness Ra measured by an atomic force microscope. Before growing the group III nitride single crystal layer on the base substrate, the base substrate may be polished such that the surface roughness Ra of the main face becomes 0.5 nm or less. The total concentration of impurities in the base substrate is preferably no more than $1\times10^{20}$ cm$^{-3}$, more preferably no more than $5\times10^{19}$ cm$^{-3}$, and further preferably no more than $1\times10^{18}$ cm$^{-3}$. The impurity concentration being the above upper limit or less makes it possible to suppress the variation in the lattice constant of the group III nitride single crystal itself due to impurities, and thus making it possible to suppress generation of a strain caused by the mismatch of the lattice constant between the base substrate and the group III nitride single crystal layer grown over the substrate. The face orientation of the crystal growth surface of the base substrate is not particularly limited, and it may be any of +c-plane, −c-plane, m-plane, and a-plane, or may be a face orientation other than them.

(Vapor Phase Growth Method of Group III Nitride Single Crystal Layer)

As described above, a group III nitride single crystal can be grown by a known vapor phase growth method such as sublimation method, physical vapor phase transport (PVT) method, metalorganic chemical vapor deposition (MOCVD) method, or hydride vapor phase epitaxy (HVPE) method.

Growth of a group III nitride single crystal layer by HVPE method is carried out by supplying a group III metal halide gas and a nitrogen source gas, which are raw material gases, as diluted with a carrier gas respectively, into a reactor in which a base substrate is placed, and making the both gases react with each other on the base substrate which is heated. Preferred examples of the group III metal halide gas include gallium chloride gas and aluminum chloride gas, and they can be obtained by bringing a high-purity group III metal having a purity of 99.9999 mass % or more into contact with a high-purity hydrogen chloride gas or a high-purity chlorine gas having a purity of 99.999 mass % or more. As the nitrogen source gas, ammonia gas can be suitably used. As the carrier gas, a gas known as a carrier gas, such as hydrogen, nitrogen, argon, or helium, whose dew point is controlled to be −110° C. or less (that is, moisture is removed) can be suitably used. Each of the raw material gases may be supplied as a mixed gas with a hydrogen halide gas such as hydrogen chloride. The heating temperature of the base substrate, the supply amount of the group III metal halide gas, and the supply amount of the nitrogen source gas, and the line velocity of the supplied gases are factors affecting the crystal growth rate, and can be appropriately determined according to the desired crystal growth rate. When a gallium nitride single crystal is grown as the group III nitride single crystal, the heating temperature of the base substrate is preferably 900 to 1600° C., and more preferably 1000 to 1200° C. When an aluminum nitride single crystal is grown as the group III nitride single crystal, the heating temperature of the base substrate is preferably 1200 to 1800° C., more preferably 1350 to 1700° C., and further preferably 1450 to 1600° C. The substrate may be heated by a known heating means such as resistance heating, high frequency induction heating, and light heating, and the heating means may be used alone or in combination. It is further noted that the group III nitride single crystal layer may be grown while irradiating light having an energy greater than the band gap energy of the group III nitride single crystal. For example, when an aluminum nitride single crystal is grown as the group III nitride single crystal, light from a light source such as an excimer lamp filled with a rare gas such as xenon gas or a halogen gas and a mercury lamp filled with mercury may be irradiated, which makes it possible to obtain a Fermi level effect, i.e., to suppress formation of point defects in the group III nitride single crystal by controlling the defect generation energy, and which also makes it possible to suppress formation of compensation defects which are formed in the crystal such that electrical neutrality is maintained when a n-type or p-type dopant is supplied together during growth of the group III nitride single crystal.

The supply amount of the group III metal halide gas which is a raw material gas may be, for example, 0.001 to 500 sccm, and the supply amount of the nitrogen source gas may be, for example, 0.01 to 5000 sccm. In addition, in order to rectify the gas flow inside the reactor, it is also advantageous to install a dry pump on the downstream side of the apparatus, to maintain a constant pressure inside the reactor and to promote exhaust from the reactor. The pressure inside the reactor during crystal growth is preferably maintained at a 100 to 1000 Torr, and more preferably 360 to 760 Torr.

When the group III nitride single crystal layer is grown by sublimation method, the base substrate is fixed on one side of a growth crucible arranged in a reactor, and a group III nitride polycrystalline raw material is placed on an opposite side of the base substrate in the growth crucible, and a temperature gradient is provided between the base substrate side and the polycrystalline raw material side under a nitrogen atmosphere, whereby the polycrystalline raw material is vaporized and a single crystal is deposited on the base substrate. As a material of the crucible, tungsten, tantalum carbide, or the like is generally employed. In crystal growth by sublimation method, the growth temperature is preferably 1800 to 2300° C., and the pressure in the reactor is preferably controlled to be 100 to 1000 Torr. The group III nitride polycrystalline raw material is preferably purified by sublimation in advance before being used, to remove impurities.

By the above method, a group III nitride single crystal can be prepared. Further, if the group III nitride single crystal layer is used as the group III nitride single crystal substrate, the base substrate may be removed from the resulting layered body, to prepare a group III nitride single crystal substrate consisting of the grown group III nitride single crystal layer. The base substrate may be removed from the layered body by a known processing means such as machining, laser processing, and etching, or by carrying out slicing by means of a wire saw or laser inside the group III nitride single crystal layer or inside the base substrate or at the interface of the group III nitride single crystal layer and the base substrate. If the base substrate is removed by slicing, the base substrate after slicing may be reused as a base substrate for preparing another group III nitride single crystal substrate, after the surface of the main face (sliced surface) is processed by e.g., grinding or polishing.

((2) Grinding Step S20)

The group III nitride single crystal obtained in the (1) preparation step S10 is subjected to a grinding step S20 of grinding the surface of the main face of the single crystal and the surface of the back face of the single crystal which is opposite to the main face. The group III nitride single crystal obtained in the (1) preparation step S10 suffers increased variation in the thickness of the group III nitride single crystal layer derived from variation in the growth rate of the group III nitride single crystal in the crystal growth surface (main face), and suffers increased surface roughness of the main face and the back face derived from roughening and/or contamination of the surface during crystal growth. The grinding step is therefore carried out, so as to reduce the surface roughness of the main face and the back face of the obtained group III nitride single crystal, and adjusting the thickness of the obtained group III nitride single crystal. If the shape of the main face of the group III nitride single crystal is a partially distorted circle or partially distorted regular polygon, a part of the periphery of the single crystal may be ground, to make the shape of the main face of the single crystal to be a circular or regular polygonal shape.

Examples of grinding methods include: a method in which the substrate is fixed on a plate made of e.g., a ceramic material with an adhesive, a wax, or the like, and a rotating grinding wheel with fixed abrasive grains is brought into contact with the surface of the main face; and a method in which the substrate surface is ground while rotating a metal platen with free abrasive grains flowing. The form of abrasive grains used in the grinding process may be abrasive grains fixed on a metal, a resin, or the like, or may be free abrasive grains. In addition, common abrasive grains such as diamond, silicon carbide, and boron carbide can be used as abrasive grains. Particle size of abrasive grains used in the grinding may be, for example, 1 to 100 μm, and the grinding rate may be, for example, 0.1 to 100 μm/min. The amount of grinding can be appropriately determined, considering the amount of polishing in the (3) polishing step S30 described later. As regards the surface roughness, considering the flatness after the (3) polishing step S30 described later, it is preferable to perform the grinding until the entire surface is ground and variation in the thickness of the substrate as fixed on a plate becomes 5 μm or less. The variation in the thickness of the substrate as fixed on the plate can be evaluated, for example, as the difference between the maximum value and the minimum value of the measured values of the thickness at five points in total: i.e., the center (one point) and four points at the periphery, that is, the difference between the maximum value and the minimum value of the measured values of the thickness at five points in total: i.e., the first to fourth measurement points described above in relation to the TTV and the center of the substrate (see FIG. 8). The thickness of the substrate can be measured by means of a contact-type micrometer or a non-contact-type laser distance meter (e.g., spectroscopic interferometric displacement meter SI-F series from Keyence Corporation). As the plate, a plate having a controlled surface roughness and flatness is preferably used. After the grinding of the first face is completed, the adhesive fixing the substrate on the plate is removed, and substrate is once removed from the plate and washed, and thereafter the substrate is again fixed onto the plate such that the second face (the face opposite to the first face, i.e., the other side to be ground) is exposed upward, and grinding of the second face is performed.

((3) Polishing Step S30)

The group III nitride single crystal obtained in the (2) grinding step S20 is subjected to the polishing step S30 of polishing the surface of the main face of the single crystal and the back face of the single crystal which is opposite to the main face. The production method S100 of the present invention is characterized in that the (3) polishing step S30 comprises, in the sequence set forth:

(3-1) carrying out the polishing such that a ratio $w_{main}/w_{back}$ ($=\delta_1$) becomes 0.5 to 10, to obtain a group III nitride single crystal precursor substrate, wherein the $w_{main}$ is a $1/1000$ intensity width of an X-ray rocking curve of a low-index diffraction plane parallel to the main face at a center of the main face of the group III nitride single crystal, and wherein the $w_{back}$ is a $1/1000$ intensity width of an X-ray rocking curve of the low-index diffraction plane parallel to the main face at a center of the back face of the single crystal (the first polishing step S31); and (3-2) carrying out the polishing such that a $1/1000$ intensity width of an X-ray rocking curve of a low-angle incident plane at the center of the main face of the group III nitride single crystal precursor substrate obtained in the (3-1) (the first polishing step S31) becomes no more than 1200 arcsec (the second polishing step S32).

((3-1) The First Polishing Step S31)

In the first polishing step S31, polishing is carried out such that a ratio $\delta_1=w_{main}/w_{back}$ becomes 0.5 to 10, wherein the $w_{main}$ is a $1/1000$ intensity width of an X-ray rocking curve of a low-index diffraction plane parallel to the main face at a center of the main face of the group III nitride single crystal, and wherein the $w_{back}$ is a $1/1000$ intensity width of an X-ray rocking curve of the low-index diffraction plane parallel to the main face at a center of the back face of the single crystal. Hereinafter, the group III nitride single crystal substrate which is obtained by the first polishing step S31 will be referred to as a group III nitride precursor substrate, and a substrate which is finally obtained after the second polishing step S32 described later will be referred to as a group III nitride single crystal substrate. Finally obtaining the final group III nitride single crystal substrate by polishing the main face after having the group III nitride precursor substrate in such a condition, makes it possible to improve the radius of curvature of the main face as well as the radius of curvature of the crystal lattice plane. The ratio $\delta_1$ is more preferably 1 to 8, and further preferably 1.5 to 6. It is noted that the center of the back face of the group III nitride single crystal is defined in the same manner as the center of the main face.

The polishing may be carried out by a known method such as chemical mechanical polishing (CMP) method, or mechanical polishing using diamond abrasive grains or the like. Although the polishing of the crystal growth surface (that is, the main face) and the polishing of the back face opposite to the crystal growth surface may be carried out by the same polishing method, or may be carried out by different polishing methods, it is preferable to employ the CMP method. The polishing by the CMP method may be carried out by a known method without particular limitation. For example, the CMP polishing can be performed by: dropping a slurry onto a nonwoven fabric or suede-type pad, wherein the slurry has a pH of 2 to 11 and comprises 20 to 45 mass % of a colloidal silica having a primary particle diameter of 20 to 80 nm; and applying pressure between a group III nitride single crystal substrate and the pad while rotating a group III nitride single crystal substrate on the pad. Generally, grinding is performed using a rigid abrasive wheel with fixed abrasive grains or a combination of a rigid metal platen having no slurry holding ability and a slurry (free abrasive grains), whereas polishing is performed using a combination of an abrasive pad of a flexible non-metallic material having slurry holding ability (e.g., a nonwoven fabric-type pad, a suede-type pad, or the like) and a slurry (free abrasive grains). Usually, the flexible non-metallic abrasive pad is used as fixed to a metal platen. The nitrogen-polar face has low chemical durability, and in particular, when it contacts with an alkaline liquid, it tends to be easily etched to have an increased surface roughness. Therefore, when polishing the nitrogen-polar face, it is also advantageous to use an acidic or neutral polishing agent.

After washing the polished substrate with flowing water, the substrate may be further washed by a commonly known semiconductor washing method, such as washing with diluted hydrofluoric acid (DHF washing), washing with a mixed solution of sulfuric acid and an aqueous hydrogen peroxide solution (SPM washing), or washing with a mixed solution of hydrochloric acid and an aqueous hydrogen peroxide solution (SC-2 washing), to remove foreign matters such as colloidal silica abrasives, metals, and organic matters. In order to prevent surface roughening of the nitrogen-polar face due to the washing agent during washing, it is also advantageous to use a commercially available washing agent whose pH is adjusted within a range of 4 to 10, preferably within a range of 5 to 9, and to further employ ultrasonic washing and/or scrubbing washing in combination, to remove abrasives, metals, organic matters, etc.

As regards polishing of a substrate, it is known to efficiently process both faces of a substrate by means of a double-sided simultaneous polishing machine. However, the group III element-polar face and the nitrogen-polar face of a group III nitride single crystal greatly differ in their chemical durability, and generally, the nitrogen-polar face has a lower chemical durability than that of the group III element-polar face. Derived from this, the processing rate of the nitrogen-polar face is faster than that of the group III element-polar face. Thus, if a double-sided simultaneous polishing machine is applied to a group III nitride single crystal, the nitrogen-polar face side is more polished than the group III element-polar face is, which makes it remarkably difficult to control the thickness of the substrate. In the production method S100 of the present invention, it is preferable to polish the group III element-polar face and the nitrogen-polar face one side at a time such that the ratio bi falls within a predetermined range, and they may be repeatedly polished one side at a time alternately. The group III polar face may be polished last to complete the first polishing step S31, or the nitrogen-polar face may be polished last to complete the first polishing step S31. For example, if the main face and the back face of the group III nitride single crystal substrate are the group III element-polar face and the nitrogen-polar face respectively, it is preferable that the nitrogen-polar face (the back face) is polished last to complete the first polishing step S31 such that the ratio bi falls within a predetermined range, in view of reducing the risk of latent damage in the main face over which a device layer is grown and given the fact that the (3-2) second polishing step S32 described later comprises final polishing of the main face.

Although the smaller number of times of alternately repeating the polishing of the group III element-polar face and the polishing of the nitrogen-polar face is of course advantageous in terms of cost, the polishing of each surface may be repeated by any number of times depending on the finished condition of the polished surface. It is also noted that in each processing stage of the grinding step S20 and the polishing step S30, the same surface may be processed a plurality of times while changing the grinding/polishing conditions; and that in each grinding/polishing processing stage, the grinding/polishing may be performed while changing a grinding wheel number, a particle size and/or pH or the like of the a lapping slurry and a CMP slurry as appropriate; and that in each grinding/polishing stage, the grinding/polishing may be performed while changing grinding/polishing conditions such as pressure, load, the rotation speed of the platen, temperature, the material of the platen, the material of the polishing pad as appropriate.

It is noted that each of the surface layers of the main face and the back face after performing the (2) grinding step S20 and of the back face (the surface of the side joined with the base substrate) after the base substrate is removed from the layered body obtained in the (1) preparation step S10, the layered body comprising the base substrate and the group III nitride single crystal layer arranged over the base substrate, suffers formation of a layer having a strain or disturbance of the crystal lattice (hereinafter may be referred to as "damaged layer") due to each preceding processing. Since the damaged layer of the main face and the damaged layer of the back face are different from each other, the difference of the damaged layers causes curvature of the group III nitride single crystal substrate. For example, when the damaged layer due to grinding remains on one side of the group III nitride single crystal substrate, the substrate is curved such that the side where the damaged layer remains becomes convex-shaped. If a device is fabricated using the group III nitride single crystal substrate in such a condition, variation in the performance of the device occurs, presumably because composition unevenness, stress, and/or defects occur in the group III nitride semiconductor layer which is to serve as a device layer, derived from bending of the crystal axis and/or curvature of the outermost surface of the crystal growth surface. Accordingly, in the production method S100 of the present invention, it is preferable to finally remove the damaged layers on the front face (the main face) and on the back face in the (3) polishing step S30. In the (3) polishing step S30, it is preferable to carry out the grinding step S20 and the first polishing step S31 while leaving the damaged layer of the front face (the main face) and the back face to some extent, and to carry out polishing of the main face and the back face in the first polishing step S31 such that the ratio bi falls within a predetermined range, to obtain the group III nitride single crystal precursor substrate by performing, so as to have the group III nitride single crystal substrate which is finally obtained having a preferred radius of curvature of the crystal lattice plane and a preferred radius of curvature of the main face. Thereafter, by removing the damaged layer of the main face in the second polishing step S32, the group III nitride single crystal substrate of the present invention, which is suitable for device fabrication, can be obtained.

By the first polishing step S31 described above, the group III nitride single crystal precursor substrate having a ratio $\delta_1 = w_{main}/w_{back}$ of 0.5 to 10 can be obtained, wherein the $w_{main}$ is the 1/1000 intensity width of the X-ray rocking curve of the low-index diffraction plane parallel to the main face at the center of the main face of the group III nitride single crystal, and wherein the $w_{back}$ is the 1/1000 intensity width of the X-ray rocking curve of the low-index diffraction plane parallel to the main face at the center of the back face of the single crystal. The 1/1000 intensity width $w_{main}$ of the X-ray locking curve of the low-index diffraction plane parallel to the main face at the center of the main face of the precursor substrate is preferably no more than 3500 arcsec, more preferably no more than 2500 arcsec, and further preferably 1500 arcsec. The 1/1000 intensity width $w_{back}$ of the X-ray locking curve of the low-index diffraction plane parallel to the main face at the center of the back face of the precursor substrate is preferably no more than 1000 arcsec, more preferably no more than 500 arcsec, and further preferably no more than 300 arcsec.

((3-2) The Second Polishing Step S32)

In the second polishing step S32, polishing is carried out such that a 1/1000 intensity width of an X-ray rocking curve of a low-angle incident plane at the center of the main face of the group III nitride single crystal precursor substrate obtained in the first polishing step S31 becomes no more than 1200 arcsec. Creating such a condition offers suppression of lattice relaxation of a group III nitride semiconductor layer such as a light emitting device or an electronic device when it is fabricated over the group III nitride single crystal substrate, as well as makes occurrence of latent damage tend to be suppressed. Latent damage means hidden damage derived from a deep polishing scratch which is generated in the slicing or grinding or lapping process of a group III nitride single crystal and which remains in the vicinity of the substrate surface, failing to be removed even after CMP, or damage which is minute unevenness present on the surface (minute surface roughness) and is thus difficult to detect by non-destructive inspection means such as an optical microscope. Latent damage is difficult to detect, for example, even by means of a Nomarski differential interference microscope. In many cases, latent damage reveals its presence by growth of a convex-shaped surface morphology called hillock which is continuous in a line from the position of the latent damage when a group III nitride semiconductor layer is grown over the group III nitride single crystal substrate. Hillock places are anomalous places of crystal growth, which lead to decreased reliability of devices. The polishing in the second polishing step S32 is more preferably carried out such that the 1/1000 intensity width of the X-ray rocking curve of the low-angle incident plane at the center of the main face of the substrate becomes no more than 1000 arcsec, and is further preferably carried out such that the $\frac{1}{1000}$ intensity width becomes no more than 800 arcsec.

Further, a ratio $\delta_2 = w_{main}'/w_{back}'$ is preferably 0.3 to 1.5, wherein the $w_{main}'$ is a $\frac{1}{1000}$ intensity width of an X-ray rocking curve of the low-index diffraction plane parallel to the main face at the center of the substrate after polishing of the main face of the group III nitride single crystal precursor substrate, and wherein the $w_{back}'$ is a $\frac{1}{1000}$ intensity width of an X-ray rocking curve of the low-index diffraction plane parallel to the main face at the center of the back face of the substrate after polishing of the main face of the group III nitride single crystal precursor substrate. Creating such a condition makes it possible to further improve the radius of curvature of the crystal lattice plane of the group III nitride single crystal substrate. The ratio $\delta_2$ is more preferably 0.4 to 1.2, and further preferably 0.5 to 1.0. The ratios $\delta_1$ and $\delta_2$ respectively being within the above ranges make it possible to increase the radii of curvature of both the main face and the crystal lattice plane of the group III nitride single crystal substrate, i.e., to make both closer to flat. Further, if the damaged layer of the main face is left in the first polishing step S31, it is preferable to remove the damaged layer in the second polishing step S32. In the second polishing step S32, polishing and cleaning of the substrate after polishing can be performed in the same manner as the polishing and cleaning in the (3-1) first polishing step S31 described above, respectively. By carrying out the second polishing step S32, the group III nitride single crystal substrate according to the first aspect of the present invention can be produced.

EXAMPLES

Hereinafter the present invention will be explained in detail with Examples. However, the present invention is not limited to the following Examples. In the following Examples and Comparative examples, an aluminum nitride single crystal substrate whose main face was c-plane was used as a group III nitride single crystal substrate. Measurement methods of an X-ray rocking curve, a radius of curvature of a crystal lattice plane, a radius of curvature of a growth face, and surface roughness in Examples and Comparative examples are as follows.
(X-Ray Rocking Curve Measurement)

X-ray omega rocking curves of (002) faces, (101) face, and (103) faces of group III nitride single crystal substrates and group III nitride single crystal precursor substrates were measured by means of a thin film X-ray diffractometer (X'Pert MRD from Malvern Panalytical) in combination with: a Ge(220) four-crystal monochromator module equipped with a ½° vertical slit and a cross slit for limiting the X-ray irradiation area of 2 mm in the X (horizontal) direction and 2 mm in the Y (vertical) direction; and a Xe proportional counter (PW 3011/20). The X-ray output was about 2 kW. The X-ray was generated by applying a voltage of 45 kV and a current of 45 mA to an X-ray generator using a Cu tube. For omega rocking curve measurements, an X-ray irradiation time (time constant) sufficient to measure the peak width at $\frac{1}{1000}$ of the peak intensity was set. Specifically, for measurements of omega rocking curves, the measurement interval (resolution) was set to 0.004° and the X-ray irradiation time (time constant) was set to 0.5 sec.
(Measurement of the Radius of Curvature of the Crystal Lattice Plane)

The radius of curvature of the crystal lattice plane of a group III nitride single crystal substrate was measured by observing (002) plane diffraction of the group III nitride single crystal, by means of a thin film X-ray diffractometer (X'Pert MRD from Malvern Panalytical) in combination with: a Ge(220) four-crystal monochromator module equipped with a ½° vertical slit and a cross slit for limiting the X-ray irradiation area of 2 mm in the X (horizontal) direction and 2 mm in the Y (vertical) direction; and a Xe proportional counter (PW 3011/20). The X-ray output was about 2 kW. The X-ray was generated by applying a voltage of 45 kV and a current of 45 mA to an X-ray generator using a Cu tube. For the measurement of the omega rocking curve, the measurement interval (resolution) was set to 0.004° and the X-ray irradiation time (time constant) was set to 0.5 sec. After measuring the X-ray rocking curve at two different points in the crystal growth surface, the radius of curvature $R_{CRV}$ (unit: m) was calculated by $\Delta x/\Delta \omega$, wherein the $\Delta x$ (unit: m) is the distance between the two points and wherein the $\Delta \omega$ (unit: rad) is the difference in the peak diffraction angle between the two points. The measurement points in the main face were arranged as shown in FIG. 5: they are equally spaced five points arranged on the straight line passing through the center of the main face (the center of the main face (33) and the first to fourth measurement points (P1 to P4)), and the $\Delta x$ in FIG. 5 was 10 mm. For coordinates on the straight line (34) passing through the center of the main face (33), the center of the substrate (33) was defined to have a coordinate of 0 mm. The distance between the first intersection E1 (substrate periphery) and the first measurement point P1, and, the distance between the second intersection E2 (substrate periphery) and the second measurement point P2, are at least 2 mm respectively.

Figure 10:
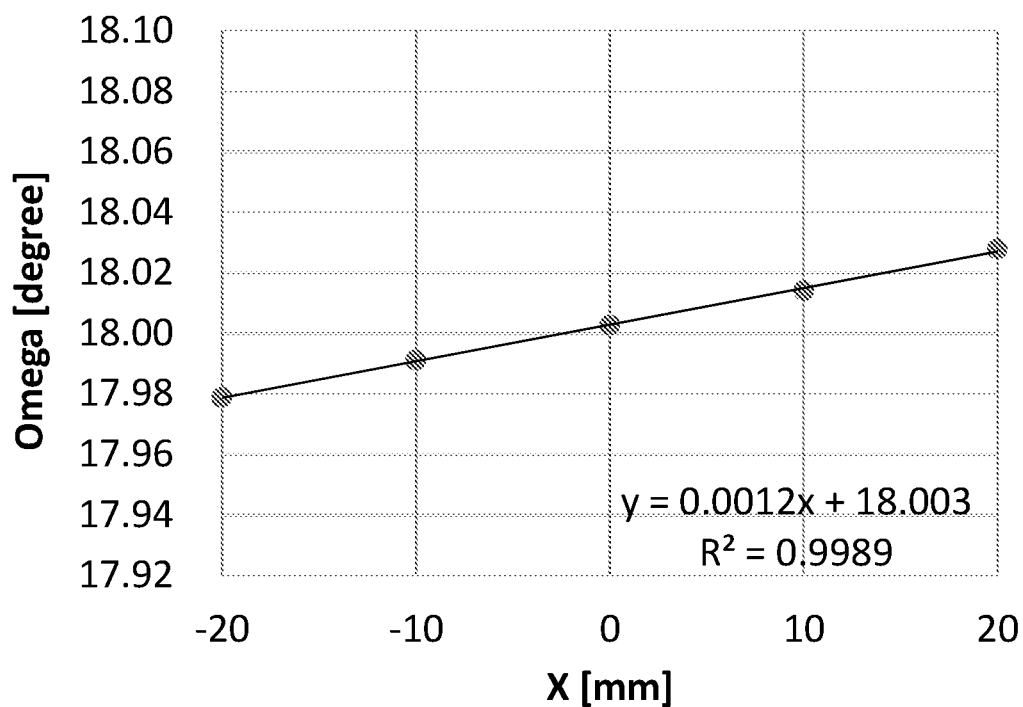
FIG. 10 is a graph showing a scattered diagram plotting, for the X-ray rocking curves of the (002) plane measured at five measurement points disposed with 5 mm intervals on a straight line passing through the substrate center of the aluminum nitride single crystal substrate produced in Example 1, the coordinates on a straight line along the horizontal axis (X-axis) and the peak diffraction angles of the X-ray rocking curves along the vertical axis (Y-axis), and showing a regression line obtained by the least squares method taking the coordinates of the measurement point as an independent variable and taking the peak diffraction angles as a dependent variable.

The radius of curvature of the crystal lattice plane at the center of the main face was calculated from the measurement results of the X-ray rocking curves at the +20 mm position and the −20 mm position. The arrangement of the two measurement points P1, P2 was as shown in FIG. 3, and the $\Delta x$ in FIG. 3 was 40 mm. The state where the crystal lattice plane was convex upward was defined to have a positive radius of curvature, and the state where the crystal lattice plane was convex downward was defined to have a negative radius of curvature. Further, the X-ray rocking curve of the (002) plane which was the low-index diffraction plane parallel to the main face was measured at 10 mm intervals on a straight line passing through the substrate center of the group III nitride single crystal substrate (the arrangement of the measurement points was as shown in FIG. 5, the measurement was carried out for a total of five positions of the first to fourth measurement points (P1 to P4) and the center of the substrate (33); the interval $\Delta x$ in FIG. 5 was 10 mm, the distance from the outermost measurement point P1, P2 to the two intersections E1, E2 of the straight line 34 and the periphery of the substrate were respectively at least 2 mm or more.), the radius of curvature $R_{CRV} = \Delta x/\Delta \omega$ was calculated for each pair of two adjacent measurement points. By taking the minimum value of the four calculated values of the radius of curvature, the radius of curvature of the crystal lattice plane in the entire main face in a plan view from the main face side of the substrate was determined. For the five measurement points, the correlation coefficient R between the coordinate on the straight line 34 of each measurement point and the peak diffraction angle of the X-ray rocking curve was calculated, and its square $R^2$ was calculated. For the group III nitride single crystal substrate obtained in Example 1, FIG. 10 shows the scatter diagram plotted by taking the coordinates of the measurement positions on the straight line 34 along the horizontal axis (X-axis) and taking the peak diffraction angle of the X-ray rocking curve along the vertical axis (Y-axis), and the regression line obtained by the least squares method taking the coordinates of the measurement points as the independent variable and taking the peak diffraction angle as the dependent variable.

(Measurement of the Radius of Curvature of the Crystal Growth Surface (Main Face))

The radius of curvature of the growth face (the main face) of the group III nitride single crystal substrate was calculated under the assumption of spherical approximation from the information of the in-plane height distribution over the entire area where the distance from the periphery of the main face is at least 2 mm. The height information of the entire face of the substrate was acquired by means of a white-light interference microscope (NewView™ 7300 from Zygo Corporation), using an objective lens with a magnification of 1 to 10 times. The white-light interference microscope NewView™ 7300 from Zygo Corporation, which was used for the measurement, automatically calculates the radius of curvature based on the information of the in-plane height distribution by the following procedure. Based on the obtained information of the in-plane height distribution, the parameters $C_0$ to $C_5$ in the equation (1), which expresses the height Z as a function of the plane coordinates (X, Y) in the plane, are determined by nonlinear least-squares fitting with plane coordinates (X, Y) as independent variables and the height Z as the dependent variable.

4

$$Z(X,Y)=C_0+C_1X+C_2Y+C_3XY+C_4X^2+C_5Y^2 \quad (1)$$

The deflection S is calculated by the equation (2) using $C_4$ and $C_5$ among the determined parameters $C_0$ to $C_5$ in the equation (1).

5

$$S=\tfrac{1}{2}(C_4+C_5)r^2 \quad (2)$$

In the equation (2), r is an in-plane distance between the center of the plane and the measurement point most distant from the center of the plane. Using the calculated deflection S, the radius-of-curvature $R_{CRV}$ is calculated by the equation (3), based on the spherical approximation.

6

$$R_{CRV} = \frac{r^2}{2S} \quad (3)$$

In the equation (3), r is as defined in the equation (2). In the same manner as for the radius of curvature of the crystal lattice plane, the state where the main face was convex upward was defined to have a positive radius of curvature, and the state where the main face was convex downward was defined to have a negative radius of curvature.

(Evaluation of the Surface Roughness of the Main Face and the Back Face)

The surface roughness Ra (arithmetic average roughness) of the main face of the group III nitride single crystal substrate was measured by observing a 4 µm² (2 µm×2 µm) field of view by means of an atomic force microscope (Nano-R™ system from Pacific Nanotechnology Inc.). The surface roughness Ra (arithmetic average roughness) of the back face was measured by observing a 58800 µm² (280 µm×210 µm) field of view by means of a white-light interference microscope (NewView™ 7300 from Zygo Corporation) with a magnification of the objective lens of 50 times. The measurement points were arranged as shown in FIG. 5, and measurements were carried out at five positions consisting of the first to fourth measurement points (P1 to P4) and the center of the substrate (33). The interval Δx in FIG. 5 was 10 mm. The outermost measurement points P1 and P2 were distant from two intersections E1 and E2 of the straight line 34 and the periphery of the substrate by at least 2 mm respectively. The surface roughness of the entire face was evaluated by the arithmetic average value of the obtained values of the surface roughness Ra at the five measurement points.

Example 1

((1) The Preparation Step S10)

In this example, an aluminum nitride single crystal substrate was produced by carrying out crystal growth by HVPE method described in Patent Literature 1 over a base substrate, and thereafter carrying out grinding processing and polishing processing. The base substrate was a commercially available aluminum nitride single crystal substrate having a diameter of 2 inches produced by the sublimation method.

Regarding the base substrate, a commercially available +c-plane aluminum nitride single crystal of 2 inches in diameter and 400 µm in thickness produced by the sublimation method was used as the base substrate. In the base substrate, the first orientation flat (distance from the center of the substrate: 24.1 mm) of m-plane was provided, and the second orientation flat (distance from the substrate center: 25.0 mm) of a-plane was provided in a position rotated by 90° clockwise from the first orientation flat. At the center of the substrate, the off angle θm inclined in the m-axis direction was 0.31°, and the off angle θa inclined in the a-axis direction was 0.00°. The dislocation density over the entire base substrate was $10^4$ cm$^{-2}$. The X-ray rocking curve half-widths of (002) plane and (101) plane in the main face which was the crystal growth surface, i.e., +c-plane, were 14 arcsec and 10 arcsec, respectively. The X-ray rocking curve half-widths of (002) plane and (101) plane in the back face, i.e., −c-plane were 19 arcsec and 11 arcsec, respectively. When grains were checked by an X-ray topographic image, neither a region having a crystal orientation deviated from that of the surroundings nor a microangular grain boundary was not observed, and thus the area of grains was 0%. Surface roughness Ra of the main face measured by the atomic force microscope was 0.1 nm. The radius of curvature of the main face was −6 m. The radius of curvature of the crystal lattice plane was −30 m. Major impurities contained were silicon, carbon, and oxygen, and their total concentration was $2\times10^{19}$ cm$^{-3}$. The absorption coefficient at a wavelength of 265 nm was 250 cm$^{-1}$.

The base substrate was subjected to ultrasonic washing (frequency: 38 kHz) in acetone for the electronics industry at 25° C. for 10 min, followed by ultrasonic washing at a frequency of 38 kHz in ethanol for the electronics industry at 50° C. for 10 min. The +c-face which was the growth face of the base substrate was further washed by scrubbing with a nylon brush and a substrate cleaning agent (CLEAN-THROUGH™ RP-1 from Kao Corporation) diluted by 100 times, to remove minute particles adhering on the substrate surface, followed by rinsing with ultrapure water. The washed base substrate was placed under a reduced pressure of 20 Torr or less, and then was again placed under an atmospheric pressure of 760 Torr by supplying nitrogen gas having a dew point of −65° C. or less, and thereafter was placed on the susceptor in the reactor of a HVPE apparatus such that the +c-face of the base substrate became a growth face.

After the base substrate was arranged in the reactor, the inside of the reactor was purged with a high-purity nitrogen gas flow, and the carrier gas was switched to a hydrogen-nitrogen mixed gas to adjust the pressure to be 750 Torr which was the pressure during growth, and the substrate temperature was raised to 1450° C. Growth of the group III nitride single crystal layer was then initiated by controlling the supply of raw material gases such that the group III metal halide gas was first supplied on to the base substrate and then the nitrogen source gas was promptly supplied onto the base substrate.

At this time, as the group III metal halide gas, an aluminum chloride gas was generated by supplying 90 sccm of hydrogen chloride gas together with a mixed carrier gas of hydrogen gas and nitrogen gas to 6N grade high-purity aluminum heated at 250° C. Further, 540 sccm of hydrogen chloride gas was supplied together with hydrogen carrier gas to the aluminum chloride gas, to form a total of 1800 sccm of mixed raw material gas inclusive of 1230 sccm of hydrogen-nitrogen mixed carrier gas, and the mixed raw material gas was introduced into the reactor. Hydrogen chloride gas was made pass through an adsorption purifier (GateKeeper™ C-HCL for hydrogen chloride, from Entegris Japan Co., Ltd.) prior to being supplied into the reactor. As the nitrogen source gas, 250 sccm of ammonia gas, 10 sccm of hydrogen chloride gas, and 40 sccm of hydrogen carrier gas, which were 300 sccm in total, were supplied to the reaction zone. In addition, 11000 sccm of a hydrogen-nitrogen mixed carrier gas comprising hydrogen gas and nitrogen gas mixed at a ratio of 7:3 was supplied as a gas flow to push the entire atmosphere in the reactor. Further, as a barrier gas to suppress the reaction between the group III metal halide gas and the ammonia gas before they reach the substrate, 4100 sccm of nitrogen gas was supplied from the space between the nozzle for supplying the group III metal halide gas and the nozzle for supplying the ammonia gas. As described above, the total flow of gases supplied into the reactor was 17200 sccm. The pressure in the system during growth was kept at 500 Torr. By maintaining the above condition, crystal growth was carried out at a growth rate of 55 to 65 μm/h for 7 hours, and then the supply of gases was stopped and the substrate was allowed to cool to the room temperature. Thus, an aluminum nitride single crystal comprising the base substrate and an aluminum nitride single crystal layer arranged over the base substrate was obtained.

((2) The Grinding Step S20)

Both the main face and the back face of the aluminum nitride single crystal (400 μm in thickness of the base substrate, 385 μm in thickness of the aluminum nitride single crystal layer at the periphery, and 455 μm in thickness at the center) prepared by HVPE method in the preparation step S10 were ground by means of a grinding wheel comprising a metal platen and #1200 diamond particles fixed on the metal platen, in the order of the main face first and then the back face. The surface of the main face was processed to be flattened such that the thickness of the aluminum nitride single crystal layer at its center portion became 350 μm. The base substrate was ground from the back face such that the thickness of the base substrate at its center became 370 μm. As a result, the total thickness of the aluminum nitride single crystal at its center became 720 μm. Furthermore, using a diamond slurry having a particle diameter of 1 μm and a copper platen, the main face and the back face of the single crystal were then subjected to lapping grinding in the order mentioned, to further planarize both surfaces. The thickness of the aluminum nitride single crystal layer on the main face side at its center was adjusted to 320 μm, and the thickness of the base substrate at its center was adjusted to 335 μm, and thus the total thickness of the aluminum nitride single crystal at its center was adjusted to 655 μm.

((3) The Polishing Step S30)

((3-1) The First Polishing Step S31)

The back face of the aluminum nitride single crystal after the grinding step S20 was polished by 40 μm thickness by CMP method using a colloidal silica abrasive (particle diameter: 20 nm, pH: 7.3) and a suede pad, and was finished to be a mirror surface, to obtain an aluminum nitride single crystal precursor substrate. The thickness of base substrate at its center became 295 μm, and the total thickness of the aluminum nitride single crystal layered body at its center became 615 μm. X-ray rocking curves of (002) plane (i.e., the low-index diffraction plane parallel to the main face) were measured for the main face and the back face of the aluminum nitride single crystal precursor substrate, and the 1/1000 intensity width of the X-ray rocking curve of the main face was 521 arcsec, and the 1/1000 intensity width of the X-ray rocking curve of the back face was 177 arcsec, and thus the ratio $\delta_1$ of the 1/1000 intensity width of the main face to that of the back face was 2.9.

((3-2) The Second Polishing Step S32)

The main face of the aluminum nitride single crystal precursor substrate obtained in the first polishing step S31 was polished using a colloidal silica abrasive (particle diameter: 20 nm, pH: 8.8) and a nonwoven fabric pad by a thickness of 12 μm, and then the pad was changed to a suede pad and the main face was further polished by a thickness of 3 μm, to obtain an aluminum nitride single crystal substrate. The thickness of the aluminum nitride single crystal layer at its center after polishing was 305 μm, the thickness of the base substrate at its center after polishing was 295 μm, and the total thickness of the aluminum nitride single crystal substrate at its center after polishing was 600 μm. After the polishing, the substrate was flowing water-rinsed (flow rate: 1.8 L/min) with pure water for 5 minutes, and then the substrate was immersed in a 1% aqueous hydrofluoric acid solution in a Teflon™ beaker for 5 minutes to remove the colloidal silica abrasive. The obtained substrate was further flowing water-rinsed with pure water for 1 minute (flow rate: 1.8 L/min), and then was dried by spin-drying at a rotation speed of 6000 rpm for 30 seconds.

The thickness variation (TTV) of the obtained aluminum nitride single crystal substrate was evaluated to be 3 μm, based on thickness measurement results at nine in-plane positions. At the center of the substrate, the off angle θm inclined in the m-axis direction was 0.30°, and the off angle θa inclined in the a-axis direction was 0.00°. The obtained aluminum nitride single crystal substrate was evaluated by X-ray rocking curve measurement at the center of the substrate, to find that for the (002) plane diffraction (i.e., the low-index diffraction plane parallel to the main face) of the main face and the back face, the 1/1000 intensity width of the X-ray rocking curve of the main face was 148 arcsec, the 1/1000 intensity width of the X-ray rocking curve of the back face was 162 arcsec, and thus the ratio $\delta_2$ of 1/1000 intensity width of the main face to that of the back face was 0.91. Further, the X-ray rocking curve 1/1000 intensity width of the (103) plane (i.e., the low-angle incident plane) at the center of the main face was 960 arcsec, the X-ray rocking curve 1/1000 intensity width of the (103) plane in the outer peripheral position which was by 5 mm distant from the periphery of the substrate toward center side was 870 arcsec. The same measurements were also carried out at the substrate center and at four positions which are by 10 mm distant from the center and at four positions which are by 20 mm distant from the center, i.e., at a total of nine positions, to find that measurement values at all these positions were at the same level as the above values. By observing a 2 μm×2 μm field of view in the main face by AFM, the surface roughness Ra of the main face was evaluated to be 0.1 nm, and a step terrace structure having a height difference of about 0.24 nm was clearly observed. By observing 280 μm×210 μm fields of view by means of the white-light interference microscope, the surface roughness Ra of the back face was measured to be 1.4 nm (average value of measurement values at the center of the substrate, at 4 points which were by 10 mm distant from the center, and at 4 points which were by 20 mm distant from the center, i.e., 9 measurement points in total). The entire face of the substrate except the outer peripheral area which are within 2 mm from the periphery of the substrate was observed by means of the white-light interference microscope with an objective lens having a magnification of 2.5 times, but no scratch associated with polishing was observed. The radius of curvature of the main face was −43 m. At the substrate center position of the aluminum nitride single crystal substrate, the X-ray rocking curve half width of the (101) plane (i.e., asymmetric diffraction plane) measured for the main face was 10 arcsec. The dislocation density measured by etch pit density method was $1×10^4$ $cm^{−2}$. The measurement of the dislocation density by etch pit density method was carried out by immersing the surface of the aluminum nitride single crystal into a mixed molten salt of sodium hydroxide and potassium hydroxide heated at 450° C., to make etch pits formed on the surface. The radius of curvature of the crystal lattice plane at the center of the main face of the substrate was −50 m, and the radius of curvature of the crystal lattice plane in the entire main face was −47 m. The X-ray rocking curve of the (002) plane was measured at equally spaced five measurement points arranged with an interval of 5 mm on a straight line passing through the center of the main face of the aluminum nitride single crystal substrate, and the correlation coefficient R between the coordinates of the five measurement points on the straight line and the peak diffraction angles of the X-ray rocking curve was calculated. The square $R^2$ of the correlation coefficient was calculated to be 0.999, showing uniformity over the entire substrate surface. FIG. 10 shows the scatter diagram plotted by taking the coordinates on the straight line 34 of the measurement points along the horizontal axis (X-axis) and taking the peak diffraction angle of the X-ray rocking curve along the vertical axis (Y-axis), and the regression line obtained by the least squares method taking the coordinates of the measurement points as the independent variable and taking the peak diffraction angle as the dependent variable. The impurity concentrations measured by secondary ion mass spectrometry (SIMS) were, $7×10^{16}$ $cm^{−3}$ for Si, $6×10^{16}$ $cm^{−3}$ for O, $4×10^{14}$ $cm^{−3}$ for Cl, and $1×10^{16}$ $cm^{−3}$ for B, and not detected for C and H (lower detection limit: $2×10^{16}$ $cm^{−3}$). Concentrations of metal elements other than elements measured by SIMS were measured by glow discharge mass spectrometry, but they were not detected with a lower detection limit of 0.1 ppmwt. The aluminum nitride single crystal substrate had an absorption coefficient of 6 $cm^{−1}$ at a wavelength of 265 nm and had a thermal conductivity of 330 W/m·K.

(Growth of a Group III Nitride Semiconductor Layer on the Group III Nitride Single Crystal Substrate)

Subsequently, a light emitting device structure was grown as group III nitride semiconductor layers by MOCVD method, over the aluminum nitride single crystal substrate, and the crystal quality of the group III nitride semiconductor layers were examined. Right before the MOCVD step, minute particles were removed by scrubbing-washing using a polyurethane foam and SUNWASH MD-3041 (from Lion Corporation) diluted by 20 times, and then the substrate was immersed in a mixed solution of phosphoric acid and sulfuric acid heated at 90° C. (phosphoric acid:sulfuric acid=1:3 (mixing volume ratio)) for 10 minutes to remove the natural oxide film on the surface. Then, an n-type layer ($Al_{0.7}Ga_{0.3}N$), an active layer (well layer: $Al_{0.5}Ga_{0.5}N$, barrier layer: $Al_{0.7}Ga_{0.3}N$), an electron blocking layer (AlN layer), a p-type cladding layer ($Al_{0.8}Ga_{0.2}N$), and a p-type contact layer (GaN layer) were formed over the main face of the substrate by MOCVD method.

Figure 11:
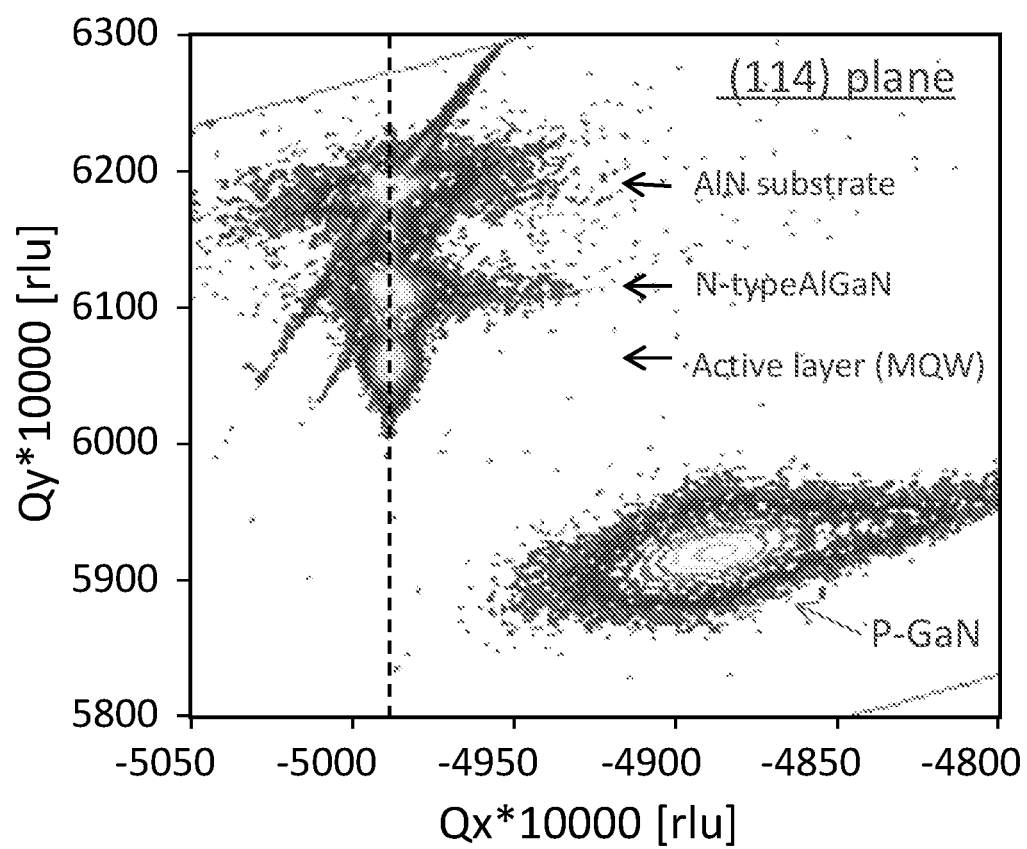
FIG. 11 is a measurement result of the reciprocal lattice mapping of the device layer grown over the main face of the aluminum nitride single crystal substrate produced in Example 1.

The surface shape of the entire growth of the grown group III nitride semiconductor layer was observed by the Nomarski differential interference microscopy. If latent damage was present in the vicinity of the surface of the group III nitride single crystal substrate, a surface morphology called a linear hillock, which is a convex-shaped portion continuous from the latent damage, would appear in the group III nitride semiconductor layer. However, a linear hillock was not observed in this example. Then, the reciprocal lattice mapping measurement of the group III nitride semiconductor layer was conducted by means of the thin film X-ray diffractometer (X'Pert MRD from Panalytical Corporation). The reciprocal lattice mapping measurement was performed using a Ge(220) four-crystal monochromator module equipped with a ½° vertical slit and a cross slit for limiting the X-ray irradiation area of 2 mm in the X (horizontal) direction and 2 mm in the Y (vertical) direction; and a semiconductor X-ray detector (PIXcel-3D detector), such that the (114) diffraction plane of aluminum nitride and the (114) diffraction plane of gallium nitride are included. FIG. 11 shows the measurement result of the reciprocal lattice mapping. The reciprocal lattice points of the n-type layer, the active layer, and the p-type cladding layer grown over the aluminum nitride single crystal substrate had almost the same Qx values as the reciprocal lattice point of the aluminum nitride single crystal substrate in the reciprocal lattice mapping, which confirmed the n-type layer, the active layer, and the p-type cladding layer were grown coherently with the aluminum nitride single crystal substrate, without occurrence of lattice relaxation.

Example 2

An aluminum nitride single crystal substrate was produced by the same procedure as in Example 1, except that in the grinding process, the amount of the lapping grinding of the main face was reduced by about 10 μm in thickness. The bi of the aluminum nitride single crystal precursor substrate after the (3-1) first polishing step S31 was 4.2. Thereafter, as a result of performing polishing of the main face in the (3-2) second polishing step S32, the ¹⁄₁₀₀₀ intensity width of the X-ray rocking curve of the (103) plane (the low-angle incident plane) at the center of the main face of the aluminum nitride single crystal substrate was 1105 arcsec, and the ¹⁄₁₀₀₀ intensity width of the X-ray rocking curve of the (103) plane at the outer peripheral position located at 5 mm from the periphery of the substrate toward the center side was 1035 arcsec. The radius of curvature of the crystal lattice plane at the center of the main face of the substrate was −28 m, and the radius of curvature of the crystal lattice plane in the entire main face was −26 m, and the X-ray rocking curve half width of the (101) plane (the asymmetric diffraction plane) was 11 arcsec, which were good characteristics, but the radius of curvature of the main face became −35 m. Anomalies such as lattice relaxation and latent damage did not occur in the device layer grown over the aluminum nitride single crystal substrate. Other results are shown in Table 1.

Example 3

In the grinding step S20, the lapping grinding of the main face was not carried out; a grinding wheel comprising a metal platen and diamond particles of #2000 fixed to the metal platen was used; the amount of grinding was increased by 30 μm in thickness compared to Example 1; and the amount of the lapping grinding of the back face was reduced by 10 μm compared to Example 1. As for the polishing of the back face, the amount of the CMP polishing by means of the suede pad in the polishing of the main face in the second polishing step S32 was increased to about 7 μm in thickness. Except the above changes, an aluminum nitride single crystal substrate was produced by the same procedure as in Example 1. The $\delta_1$ of the aluminum nitride single crystal precursor substrate after the first polishing step S31 was 6.2. Then, as the result of the polishing of the main face in the second polishing step S32, the $1/1000$ intensity width of the X-ray rocking curve of the (103) plane (the low-angle incident plane) at the center of the main face of the aluminum nitride single crystal substrate was 738 arcsec, the $1/1000$ intensity width of the X-ray rocking curve of the (103) plane at the outer peripheral position located at 5 mm away from the periphery of the substrate toward the center side was 786 arcsec. The radius of curvature of the crystal lattice plane at the center of the main face of the substrate was −12 m, and the radius of curvature of the crystal lattice plane in the entire main face was −12 m, the X-ray rocking curve half width of the (101) plane (the asymmetric diffraction plane) was 17 arcsec, which were good characteristics, but the radius of curvature of the main face became −13 m. Anomalies such as lattice relaxation and latent damage did not occur in the device layer grown over the aluminum nitride single crystal substrate. Other results are shown in Table 1.

Example 4

In the grinding step S20, the lapping grinding of the main face was not carried out; a grinding wheel comprising a metal platen and diamond particles of #2000 fixed to the metal platen was used; and the amount of grinding was increased by 30 μm compared to Example 1. As for polishing of the back face, the amount of the CMP polishing in the first polishing step S31 was changed to be 30 μm. Further, the amount of the CMP polishing in the polishing of the main face by the suede pad in the second polishing step S32 was increased to about 7 μm in thickness. Except for the above changes, an aluminum nitride single crystal substrate was produced by the same procedure as in Example 1. The $\delta_1$ of the aluminum nitride single crystal precursor substrate after the first polishing step S31 was 5.1. Then, after carrying out the polishing of the main face in the second polishing step S32, the $1/1000$ intensity width of the X-ray rocking curve of the (103) plane (low-angle incident plane) at the center of the main face of the aluminum nitride single crystal substrate was 810 arcsec, the $1/1000$ intensity width of the X-ray rocking curve of the (103) plane at the outer peripheral portion located at 5 mm away from the periphery of the substrate toward the center side was 920 arcsec. The radius of curvature of the crystal lattice plane at the center of the main face of the substrate was −19 m, the radius of curvature of the crystal lattice plane in the entire main face was −18 m, the X-ray rocking curve half width of the (101) plane (asymmetric diffraction plane) was 12 arcsec, which were good characteristics, but the radius of curvature of the main face became −16 m. Anomalies such as lattice relaxation and latent damage did not occur in the device layer grown over the aluminum nitride single crystal substrate. Other results are shown in Table 1.

Comparative Example 1

An aluminum nitride single crystal precursor substrate was obtained in the same manner as in Example 1, except that in the grinding step S20, the lapping grinding of the main face was not carried out; the main face was ground by means of a grinding wheel comprising a metal platen and diamond particles of #1200 fixed to the metal platen; and the amount of the grinding was increased by 25 μm in thickness. The amount of the CMP polishing by means of the suede pad in the polishing of the main face in the second polishing step S32 was changed to be 8 μm in thickness. Except for the above changes, an aluminum nitride single crystal substrate by the same procedure as in Example 1. The $\delta_1$ of the aluminum nitride single crystal precursor substrate after the first polishing step S31 was 23.3. Then, as the result of carrying out the polishing of the main face of the second polishing step S32, the $1/1000$ intensity width of the X-ray rocking curve of the (103) plane (low-angle incident plane) at the center of the main face of the aluminum nitride single crystal substrate was 1041 arcsec, and the $1/1000$ intensity width of the X-ray rocking curve of the (103) plane in the outer peripheral position located at the 5 mm away from the periphery of the substrate toward the center side was 1360 arcsec, indicating that the polishing in the outer peripheral portion was not applied well. The radius of curvature of the crystal lattice plane at the center of the main face of the substrate was −33 m, the radius of curvature of the crystal lattice plane in the entire main face was −31 m, and the X-ray rocking curve half width of the (101) plane (asymmetric diffraction plane) was 11 arcsec, which were good characteristics, but the radius of curvature of the main face became −7 m. Anomalies such as lattice relaxation and latent damage did not occur in the device layer grown over the aluminum nitride single crystal substrate. Other results are shown in Table 1.

Comparative Example 2

An aluminum nitride single crystal precursor substrate was obtained, but in the grinding step S20, the lapping grinding of the main face was not carried out; the main face was ground by means of a grinding wheel comprising a metal platen and diamond particles of #2000 fixed to the metal platen; and the amount of the grinding was increased by 30 μm compared to Example 1. The amount of the CMP polishing in the polishing of the main face by means of the suede pad in the second polishing step S31 was reduced to 2 μm in thickness. Except for the above changes, an aluminum nitride single crystal substrate was produced by the same procedure as in Example 1. The bi of the aluminum nitride single crystal precursor substrate after the first polishing step S31 was 13.8. Then, as the result of carrying out the polishing of the main face of the second polishing step S32, the $1/1000$ intensity width of the X-ray rocking curve of the (103) plane (low-angle incident plane) at the center of the main face of the aluminum nitride single crystal substrate was 1219 arcsec, and the 1/1000 intensity width of the X-ray rocking curve of the (103) plane in the outer peripheral position located at 5 mm away from the periphery of the substrate toward the center side was 1430 arcsec. The radius of curvature of the crystal lattice plane at the center of the main face of the substrate was 50 m, the radius of curvature of the crystal lattice plane in the entire main face was 45 m, and the X-ray rocking curve half width of the (101) plane (asymmetric diffraction plane) was 10 arcsec, which were good characteristics, but the radius of curvature of the main face became 8 m. The measurement result of the reciprocal lattice mapping of the device layer grown over the aluminum nitride single crystal substrate showed that Qx values of the n-type layer, the active layer, and the p-type cladding layer approached the Qx value of p-GaN layer, which indicated occurrence of lattice relaxation.

Comparative Example 3

In the grinding step S20, the lapping grinding of the main face was not carried out; the main face was ground by means of a grinding wheel comprising a metal platen and diamond particles of #2000 fixed to a metal platen; and the amount of the grinding was increased by 30 μm compared to Example 1. The amount of the CMP polishing of the back face in the first polishing step S31 was of reduced to 30 μm in thickness, to obtain an aluminum nitride single crystal precursor substrate. Except for the above changes, an aluminum nitride single crystal substrate was produced in the same manner as in Example 1. The bi of the aluminum nitride single crystal precursor substrate after the first polishing step S31 was 7.4. Then, as the result of carrying out the second polishing step S32, the 1/1000 intensity width of the X-ray rocking curve of the (103) plane (low-angle incident plane) at the center of the main face of the aluminum nitride single crystal substrate was 1305 arcsec, the 1/1000 intensity width of the X-ray rocking curve of the (103) plane in the outer peripheral position located at 5 mm away from the periphery of the substrate toward the center side was 1390 arcsec. The radius of curvature of the crystal lattice plane at the center of the main face of the substrate was −41 m, the radius of curvature of the crystal lattice plane in the entire main face was −36 m, and the X-ray rocking curve half width of the (101) plane (asymmetric diffraction plane) was 11 arcsec, which were good characteristics, and the radius of curvature of the main face became −12 m. However, lattice relaxation occurred during growth of the device layer over the aluminum nitride single crystal substrate, and Qx values of the n-type layer, the active layer, and the p-type cladding layer in the reciprocal lattice mapping approached the Qx value of the p-GaN layer. Moreover, by observation of the device layer using the Nomarski differential interference microscope, 10 linear hillocks, presumably due to latent damage present in the surface of the aluminum nitride single crystal substrate, were observed.

Comparative Example 4

In the grinding step S20, the lapping grinding of the main face was not carried out; the grinding was carried out by means of a grinding wheel comprising a metal platen and diamond particles of #2000 fixed to the metal platen; and the amount of the grinding was increased by 30 μm compared to Example 1. The lapping grinding of the back face was carried out but the CMP processing of the back face was not carried out, to obtain an aluminum nitride single crystal precursor substrate. Further, the CMP polishing of the main face by means of the suede pad in the second polishing step S32 was not performed, and the amount of the CMP polishing using the nonwoven fabric pad was reduced by 5 μm. Except for the above changes, an aluminum nitride single crystal substrate was produced in the same manner as in Example 1. Derived from changing the grinding conditions of the main face and the polishing conditions of the back face, the $\delta_1$ of the aluminum nitride precursor substrate after the first polishing step S31 was 1.9. The 1/1000 intensity width of the X-ray rocking curve of the (103) plane (low-angle incident plane) at the center of the main face of the aluminum nitride single crystal substrate after the second polishing step S32 was 3638 arcsec. The radius of curvature of the crystal lattice plane at the center of the main face of the substrate was 34 m, the radius of curvature of the crystal lattice plane in the entire main face was 34 m, the radius of curvature of the main face was −22 m, and the X-ray rocking curve half-width of the (101) plane was 12 arcsec, which were good characteristics. However, lattice relaxation of a large degree occurred during the growth of the device layer over this aluminum nitride single crystal substrate. In the measurement result of the reciprocal lattice mapping, Qx values of the n-type layer, the active layer, and the p-type cladding layer approached more to the Qx value of the p-GaN layer, than in Comparative example 3. Further, by observation of the device layer by means of the Nomarski type differential interference microscope, many linear hillocks, in excess of 10, presumably due to latent damage present in the surface of the aluminum nitride single crystal substrate, were observed.

TABLE 1

| | Precursor substrate | | | Group III nitride single crystal substrate | | | |
| --- | --- | --- | --- | --- | --- | --- | --- |
| | 1/1000 intensity width of (002) plane @main face [arcsec] | 1/1000 intensity width of (002) plane @back face [arcsec] | 51 | 1/1000 intensity width of (103) plane @main face [arcsec] | 1/1000 intensity width of (002) plane @main face [arcsec] | 1/1000 intensity width of (002) plane @back face [arcsec] | 52 |
| Example 1 | 521 | 177 | 2.9 | 960 | 148 | 162 | 0.91 |
| Example 2 | 1020 | 244 | 4.2 | 1105 | 160 | 223 | 0.81 |
| Example 3 | 2980 | 480 | 6.2 | 738 | 288 | 459 | 0.63 |
| Example 4 | 3300 | 646 | 5.1 | 810 | 186 | 626 | 0.30 |
| Comparative example 1 | 4800 | 206 | 23.3 | 1041 | 171 | 186 | 0.92 |
| Comparative example 2 | 3280 | 237 | 13.8 | 1219 | 212 | 206 | 1.03 |
| Comparative example 3 | 2870 | 390 | 7.4 | 1305 | 126 | 364 | 0.35 |

TABLE 1-continued

| | | | | | | | | |
|---|---|---|---|---|---|---|---|---|
| Comparative example 4 | 3700 | 1960 | 1.9 | 3638 | 529 | 1949 | 0.27 | |

| | | Group III nitride single crystal substrate | | | | | | Device layer |
|---|---|---|---|---|---|---|---|---|
| | | Crystal lattice plane | | Main face | | | | Anomalies: lattice |
| | | Radius of curvature [m] | $R^2$ | Radius of curvature [m] | FWHM (101) plane [arcsec] | Ra (Al-face) [nm] | Ra (N-face) [nm] | Step terrace structure | TTV [μm] | relaxation or latent damage |
| Example 1 | −50 | 0.99 | −43 | 10 | 0.10 | 1.4 | clear | 3 | None |
| Example 2 | −28 | 0.98 | −35 | 11 | 0.10 | 1.3 | clear | 4 | None |
| Example 3 | −12 | 0.94 | −13 | 17 | 0.10 | 1.5 | clear | 9 | None |
| Example 4 | −19 | 0.95 | −16 | 12 | 0.10 | 1.5 | clear | 7 | None |
| Comparative example 1 | −33 | 0.96 | −7 | 11 | 0.10 | 2.2 | clear | 23 | None |
| Comparative example 2 | 50 | 0.97 | 8 | 10 | 0.13 | 2.8 | clear | 31 | observed |
| Comparative example 3 | −41 | 0.93 | −12 | 11 | 0.10 | 1.3 | clear | 21 | observed |
| Comparative example 4 | 34 | 0.93 | −22 | 12 | 0.11 | 20 | None | 8 | observed |

REFERENCES SIGN LIST 10, 20, 30, 40 group III nitride single crystal substrate
11, 21, 31, 41 main face
12, 22, 32, 42 periphery
13, 23, 33, 43 center
14, 24, 34, 44 first straight line (passing through the center of the main face/substrate)

I claim:

1. A group III nitride single crystal substrate comprising:
a first main face; and
a first back face opposite to the first main face,
wherein an absolute value of a radius of curvature of the first main face of the substrate is no less than 10 m;
an absolute value of a radius of curvature of a crystal lattice plane at a center of the first main face of the substrate is no less than 10 m; and
a 1/1000 intensity width of an X-ray rocking curve of a low-angle incident plane at the center of the first main face of the substrate is no more than 1200 arcsec.

2. The group III nitride single crystal substrate according to claim 1,
wherein the absolute value of the radius of curvature of the first main face of the substrate is no less than 15 m.

3. The group III nitride single crystal substrate according to claim 1,
wherein the absolute value of the radius of curvature of the crystal lattice plane at the center of the first main face of the substrate is no less than 15 m.

4. The group III nitride single crystal substrate according to claim 1,
wherein the 1/1000 intensity width of the X-ray rocking curve of the low-angle incident plane at the center of the first main face of the substrate is no more than 1000 arcsec.

5. The group III nitride single crystal substrate according to claim 1,
wherein in a plan view from the first main face side of the group III nitride single crystal substrate, the absolute value of the radius of curvature of the crystal lattice plane is no less than 10 m in the entire first main face; and
the 1/1000 intensity width of the X-ray rocking curve of the low-angle incident plane in the entire first main face of the substrate is no more than 1200 arcsec.

6. The group III nitride single crystal substrate according to claim 1,
wherein the main face of the group III nitride single crystal substrate is a (001) plane, and the low-angle incident plane at the center of the main face of the substrate is a (103) plane.

7. The group III nitride single crystal substrate according to claim 1, which is a group III nitride single crystal layered body comprising:
a group III nitride single crystal base substrate comprising a second main face and a second back face opposite to the second main face; and
a group III nitride single crystal layer arranged over the second main face of the group III nitride single crystal base substrate, wherein the group III nitride of the group III nitride single crystal layer is the same as the group III nitride of the base substrate.

8. The group III nitride single crystal substrate according to claim 1, wherein the group III nitride single crystal substrate is an aluminum nitride single crystal substrate.

9. The group III nitride single crystal substrate according to claim 8,
wherein the first main face is an aluminum-polar face.

10. A method for producing a group III nitride single crystal substrate, the method comprising, in the sequence set forth:
(1) preparing a group III nitride single crystal, wherein the group III nitride single crystal comprises a first main face and a first back face opposite to the first main face;
(2) grinding a surface of the first main face and a surface of the first back face of the group III nitride single crystal obtained in the (1); and
(3) polishing the surface of the first main face and the surface of the first back face of the group III nitride single crystal obtained in the (2),
the (3) comprising, in the sequence set forth:
(3-1) carrying out the polishing such that a ratio $w_{main}/w_{back}$ becomes 0.5 to 10, to obtain a group III nitride single crystal precursor substrate, wherein the $w_{main}$ is a $1/1000$ intensity width of an X-ray rocking curve of a low-index diffraction plane parallel to the first main face at a center of the first main face of the group III nitride single crystal precursor substrate, and wherein the $w_{back}$ is a $1/1000$ intensity width of an X-ray rocking curve of the low-index diffraction plane parallel to the first main face at a center of the first back face of the group III nitride single crystal precursor substrate; and (3-2) carrying out the polishing such that a $1/1000$ intensity width of an X-ray rocking curve of a low-angle incident plane at the center of the first main face of the group III nitride single crystal precursor substrate obtained in the (3-1) becomes no more than 1200 arcsec.

11. The method for producing the group III nitride single crystal substrate according to claim 10, the (1) comprising:

depositing a group III nitride single crystal layer over a group III nitride single crystal base substrate by a vapor phase growth method, wherein the base substrate comprises a second main face and a second back face opposite to the second main face, and wherein the group III nitride single crystal layer is deposited over the second main face of the base substrate, and wherein the group III nitride of the group III nitride single crystal layer is the same as the group III nitride of the base substrate.

* * * * *